(12) United States Patent
Chen et al.

(10) Patent No.: US 12,244,312 B2
(45) Date of Patent: Mar. 4, 2025

(54) LOW NOISE RING OSCILLATOR DEVICES AND METHODS

(71) Applicant: Taiwan Semiconductor Manufacturing Company, Hsinchu (TW)

(72) Inventors: Yung-Shun Chen, Taoyuan (TW); Amit Kundu, Hsinchu (TW); Yung-Chow Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 32 days.

(21) Appl. No.: 18/296,629

(22) Filed: Apr. 6, 2023

(65) Prior Publication Data

US 2024/0186989 A1 Jun. 6, 2024

Related U.S. Application Data

(60) Provisional application No. 63/386,086, filed on Dec. 5, 2022.

(51) Int. Cl.
*H03K 3/03* (2006.01)
*H03K 5/134* (2014.01)
*H03K 19/0185* (2006.01)

(52) U.S. Cl.
CPC ........... *H03K 3/0315* (2013.01); *H03K 5/134* (2014.07); *H03K 19/018521* (2013.01)

(58) Field of Classification Search
CPC ................. H03K 3/0315; H03K 5/134; H03K 19/018521
See application file for complete search history.

(56) References Cited

U.S. PATENT DOCUMENTS

| | | | |
|---|---|---|---|
| 5,208,557 A * | 5/1993 | Kersh, III | ............... H03K 3/354 331/74 |
| 6,188,293 B1 | 2/2001 | Miyagi et al. | |
| 9,692,396 B2 | 6/2017 | Yu et al. | |
| 10,193,535 B2 | 1/2019 | Murata | |
| 2003/0214361 A1 | 11/2003 | Nishikido | |
| 2015/0277393 A1 | 10/2015 | Liu et al. | |
| 2016/0359473 A1 | 12/2016 | Tsai | |
| 2021/0376820 A1 * | 12/2021 | Chen | ............... H01L 21/823814 |

FOREIGN PATENT DOCUMENTS

| | | |
|---|---|---|
| CN | 1065349 C | 5/2001 |
| CN | 106133536 A | 11/2016 |
| CN | 107204756 A | 9/2017 |
| CN | 107580755 B | 2/2021 |

* cited by examiner

*Primary Examiner* — Jeffrey M Shin
(74) *Attorney, Agent, or Firm* — Merchant & Gould P.C.

(57) ABSTRACT

A device including delay cells connected in series and in a feedback loop to provide a ring oscillator. At least one of the delay cells in the ring oscillator is a stacked gate delay cell that includes two or more PMOS transistors having first drain/source paths connected in series to each other and having first gates connected to each other and two or more NMOS transistors having second drain/source paths connected in series to each other and to the first drain/source paths and having second gates connected to each other and to the first gates.

20 Claims, 17 Drawing Sheets

| 386 | 380 | 382 | 384 |
|---|---|---|---|
| Frequency=~3GHz | RO 5-stage/stack-4 | RO 9-stage/stack-4 | RO 9-stage+PL/stack-4 |
| Id Current (mA) | 1.3 | 3.8 | 5.4 |
| Vtop (mA) | 444.4 | 662.2 | 767.4 |
| Rise/fall time (ps) | 17.7/18.5 | 10.5/11.4 | 9.8/10.9 |
| PA @1Mz (dB) | -89.54 | -98.8 ⇧ -9.3dB | -101.8 ⇧ -3.0dB |
| FoM (@1MHz) | -160.4 | -163.3 | -164 |

FIG. 11

LOW NOISE RING OSCILLATOR DEVICES AND METHODS

CROSS-REFERENCE TO RELATED APPLICATION

This application claims priority from provisional application Ser. No. 63/386,086, filed on Dec. 5, 2022.

BACKGROUND

Often, a clock source generator includes a ring-oscillator or a phase-locked loop (PLL). The PLL may include a voltage-controlled oscillator (VCO) or a current-controlled oscillator (CCO), where the VCO provides an output frequency that is controlled by an input voltage and the CCO provides an output frequency that is controlled by an input current. Typically, these clock source generators suffer from device noise problems that limit the phase noise performance of the circuits. Practices for reducing noise in these circuits include using inductor-capacitor tank (LC-tank) ring oscillators, providing additional phase noise filter circuits, and even relying on process dependent low flicker noise metal-oxide semiconductor field effect transistors (MOSFETs). However, LC-tank ring oscillators include inductors and variable capacitors, which are sensitive to process variations and consume large areas on the semiconductor die. Also, additional phase noise filter circuits, such as in PLL circuits, require large design efforts for providing the complex circuit structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

FIG. 11 is a diagram schematically illustrating characteristics of three different ring oscillators (ROs), in accordance with some embodiments.

DETAILED DESCRIPTION

Figure 1:
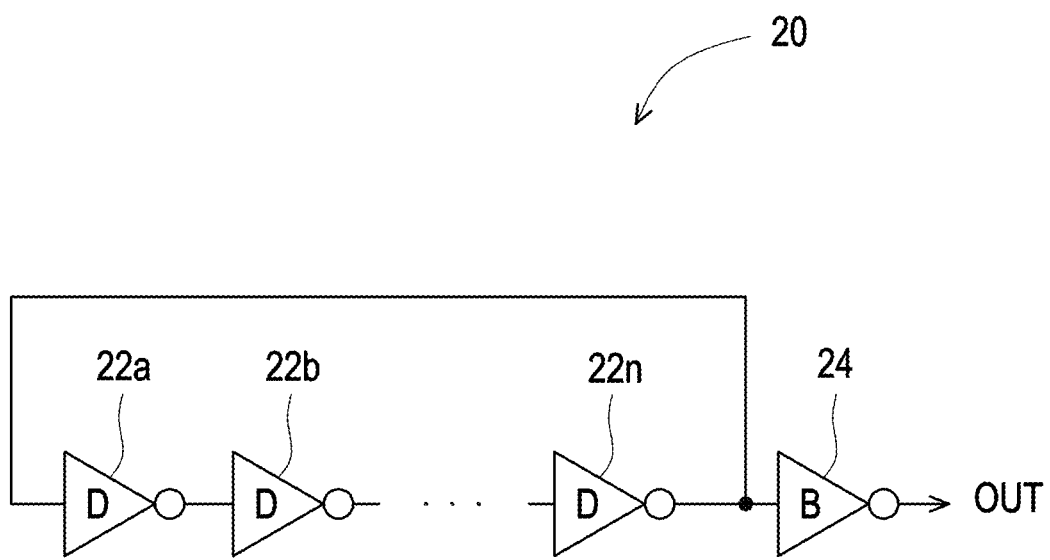
FIG. 1 is a diagram schematically illustrating a ring oscillator device that includes delay cells configured to reduce PN in the ring oscillator, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed embodiments include devices that reduce phase noise (PN) in ring oscillators, without costly inductors, variable capacitors, and/or complex filters. In some embodiments, the ring oscillators include stacked gate delay cells as described herein and, in some embodiments, the ring oscillators include delay cells with pseudo-load circuits. The stacked gate delay cells have larger channel areas that reduce the noise of the device and achieve lower PN in the ring oscillator. Also, the stacked gate delay cells can be built in fin field-effect transistor (FinFET) technologies. In the devices with pseudo-load circuits, more drain current (Id) is supplied to the delay cells, which reduces the rise and fall times of the delay cells and reduces the normalized spectral density $SiD/Id^2$, where SiD is the spectral density. In some embodiments, the PN is a ratio of the SiD of the noise at an offset frequency from a main carrier frequency to the total power of the signal. In some embodiments, the SiD of the noise is the noise power per unit bandwidth.

Disclosed embodiments include a device that includes delay cells connected in series and in a feedback loop to provide a ring oscillator, wherein at least one of the delay cells is a stacked gate delay cell that includes two or more PMOS transistors connected to two or more NMOS transistors. The two or more PMOS transistors have first drain/source paths connected in series to each other and first gates connected to each other. The two or more NMOS transistors have second drain/source paths connected in series to each other and to the first drain/source paths, and second gates connected to each other and to the first gates. In some embodiments, the device includes an odd number of delay cells in the feedback loop and, in some embodiments, each of the delay cells is an inverter.

Disclosed embodiments further include a device that includes delay cells connected in series and in a feedback loop to provide a ring oscillator, wherein at least one of the delay cells includes at least one PMOS transistor that has a first drain/source path and at least one NMOS transistor that has a second drain/source path connected to the first drain/source path. First gates of the at least one PMOS transistor and the at least one NMOS transistor are connected to each other. Also, the at least one of the delay cells includes a pseudo load PMOS transistor and a pseudo load NMOS transistor. The pseudo load PMOS transistor has drain and source regions connected to each other and to the first drain/source path and the pseudo load NMOS transistor has drain and source regions connected to each other and to the second drain/source path. Second gates of the pseudo load PMOS transistor and the pseudo load NMOS transistor are connected to each other and to the first gates.

Disclosed embodiments further include methods that include providing a ring oscillator including a plurality of delay cells connected in series and in a feedback loop and including one or more pseudo load transistors. In some embodiments, the method includes connecting a pseudo load, such as a programmable pseudo load circuit, to at least one of the delay cells, and selectively varying the pseudo load, such as by individually selectively connecting one or more pseudo load transistors to active transistors in at least one of the delay cells.

FIG. 1 is a diagram schematically illustrating a ring oscillator device 20 that includes delay cells 22a-22n configured to reduce PN in the ring oscillator 20, in accordance with some embodiments. At least one of the delay cells 22a-22n, and up to all the delay cells 22a-22n, include circuit structures that reduce the PN in the ring oscillator 20, without including costly inductors, variable capacitors, and/or complex filters. The ring oscillator 20 can be used for frequency generation in circuits, such as clock source generator circuits. The output frequency of the ring oscillator 20 is 1/(2*n*Td), wherein n is the number of delay cells 20a-20n and Td is the delay time through each of the delay cells 22a-22n. In other embodiments, the PN reduction circuits and ideas disclosed in this disclosure can be used to reduce PN in circuits and applications other than a ring oscillator.

In some embodiments, the ring oscillator 20 is manufactured in FinFET technologies. In some embodiments, the ring oscillator 20 is manufactured in gate all around (GAA) technologies, such as nano-sheet technologies. Also, in some embodiments, the ring oscillator 20 can be manufactured at different technology nodes, such as at different channel length nodes.

The ring oscillator 20 includes an odd number n of delay cells 22a-22n connected in series and in a feedback loop, where each of the delay cells 22a-22n is an inverter. The output of delay cell 22a is electrically connected to the input of delay cell 22b, the output of delay cell 22b is electrically connected to the input of delay cell 22c (not shown), and so on, up to the output of delay cell 22n-1 (not shown) is electrically connected to the input of delay cell 22n, and the output of delay cell 22n is electrically connected to the input of delay cell 22a in a feedback loop. Also, the output of the delay cell 22n is electrically connected to the input of a buffer 24 that provides an output signal OUT of the ring oscillator 20. In other embodiments, the ring oscillator 20 can include an even number of delay cells 22a-22n or an odd number of delay cells 22a-22n and, in some embodiments, one or more of the delay cells 22a-22n can be a non-inverting delay cell.

The PN in the output signal OUT of the ring oscillator 20 is measured in the frequency domain, where the output signal OUT of the ring oscillator 20 includes a primary or carrier frequency f0. In some embodiments, the PN is a ratio of the SiD at an offset frequency from the carrier frequency f0 to the total power spectrum of the output signal OUT, where the SiD is noise power per unit bandwidth. In some embodiments, the PN is a ratio of the noise in a 1-Hz bandwidth at an offset frequency from the carrier frequency f0 to the output signal OUT amplitude at the carrier frequency f0.

The PN of the ring oscillator 20 is reduced by increasing the number n of delay cells 22a-22n in the ring oscillator 20, providing one or more stacked gate delay cells in the delay cells 22a-22n, and/or including pseudo-load circuits in at least one and up to all of the delay cells 22a-22n. Increasing the number n of delay cells 22a-22n in the ring oscillator 20 results in smaller rise and fall times for each of the delay cells 22a-22n and a narrower impulse sensitivity function (ISF).

In some embodiments, the ring oscillator 20 includes stacked gate delay cells in the delay cells 22a-22n, as described herein. In some embodiments, the stacked gate delay cells have larger effective transistor channel areas that reduce the noise of the delay cell and achieve lower PN in the ring oscillator 20. In some embodiments, the stacked gate delay cells have larger effective transistor channel lengths and widths, i.e., larger effective transistor channel areas, and lower flicker noise current spectral density.

In some embodiments, the delay cells 22a-22n include pseudo-load circuits, such that delay cells 22a-22n with pseudo-load circuits receive a larger drain current (Id) that reduces: the rise and fall times of the delay cells 22a-22n; the SiD/Id of the ring oscillator 20; and the normalized spectral density $SiD/Id^2$. Also, this reduces the PN in the ring oscillator 20 and enhances the figure of merit (FoM) of the ring oscillator 20, where the FoM is a measure of the performance of the ring oscillator 20. In addition, all of this is achieved without large structural changes in the delay cells 22a-22n. In some embodiments, one or more of the delay cells 22a-22n includes programmable pseudo-load circuits that are individually selected to vary the oscillation frequency of the ring oscillator 20 and/or to lower the PN of the ring oscillator 20.

Figure 2:
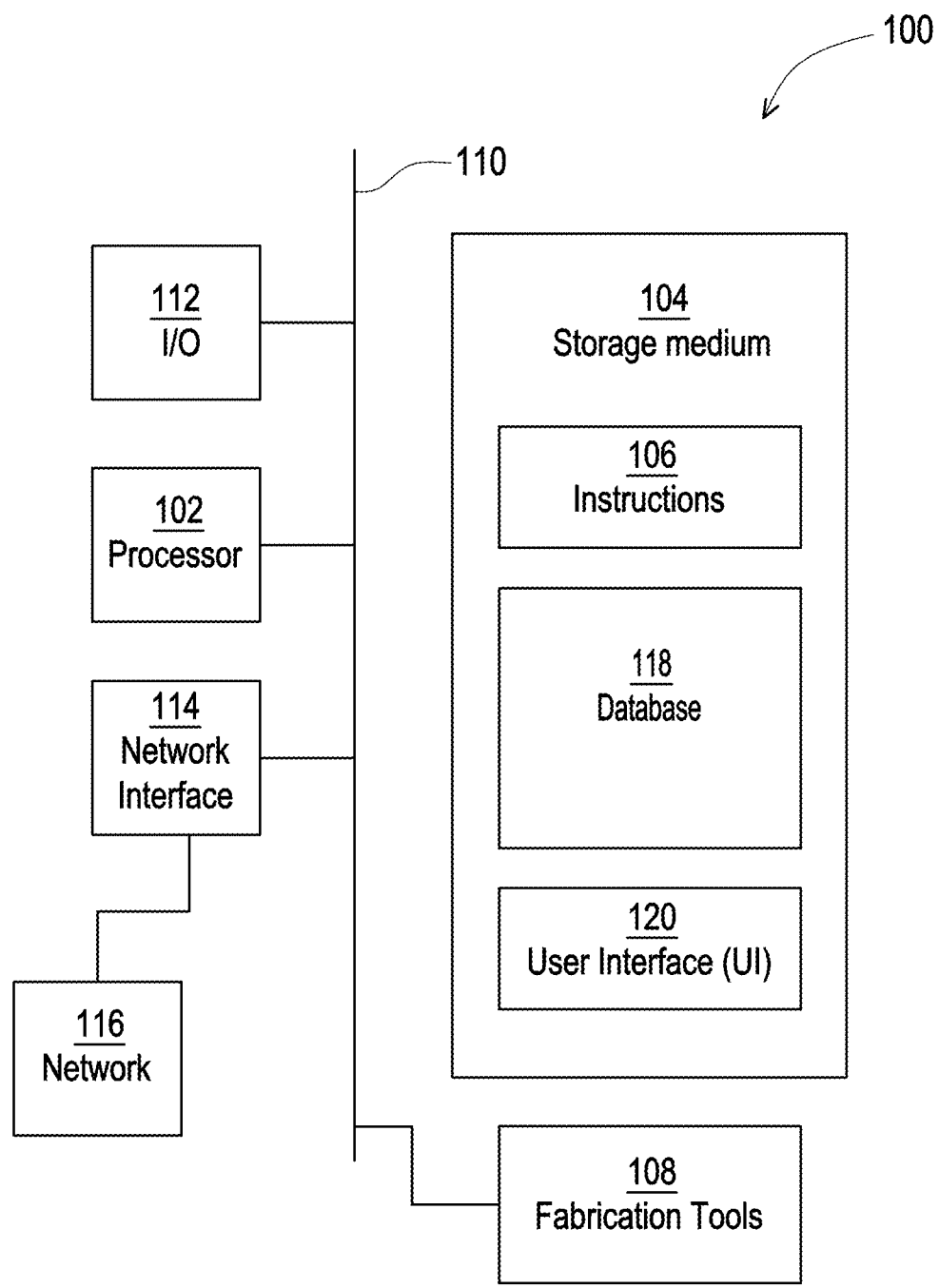
FIG. 2 is a block diagram schematically illustrating an example of a computer system configured to provide the semiconductor devices and methods of the current disclosure, in accordance with some embodiments.

FIG. 2 is a block diagram schematically illustrating an example of a computer system 100 configured to provide the semiconductor devices and methods of the current disclosure, including the ring oscillator device 20 of FIG. 1, in accordance with some embodiments. Some or all the design and manufacture of the semiconductor devices can be performed by or with the computer system 100. In some embodiments, the computer system 100 includes an electronic design automation (EDA) system. In some embodiments, the semiconductor devices are ICs.

In some embodiments, the system 100 is a general-purpose computing device including a processor 102 and a non-transitory, computer-readable storage medium 104. The computer-readable storage medium 104 may be encoded with, e.g., store, computer program code such as executable instructions 106. Execution of the instructions 106 by the processor 102 provides (at least in part) a design tool that implements a portion or all the functions of the system 100, such as pre-layout simulations, post-layout simulations, routing, rerouting, and final layout for manufacturing. Further, fabrication tools 108 are included to further layout and physically implement the design and manufacture of the semiconductor devices. In some embodiments, the system 100 includes a commercial router. In some embodiments, the system 100 includes an automatic place and route (APR) system.

The processor 102 is electrically coupled to the computer-readable storage medium 104 by a bus 110 and to an I/O interface 112 by the bus 110. A network interface 114 is also electrically connected to the processor 102 by the bus 110. The network interface 114 is connected to a network 116, so that the processor 102 and the computer-readable storage medium 104 can connect to external elements using the network 116. The processor 102 is configured to execute the computer program code or instructions 106 encoded in the computer-readable storage medium 104 to cause the system 100 to perform a portion or all the functions of the system 100, such as providing the semiconductor devices and methods of the current disclosure and other functions of the system 100. In some embodiments, the processor 102 is a central processing unit (CPU), a multi-processor, a distributed processing system, an application specific integrated circuit (ASIC), and/or a suitable processing unit.

In some embodiments, the computer-readable storage medium 104 is an electronic, magnetic, optical, electromagnetic, infrared, and/or semiconductor system or apparatus or device. For example, the computer-readable storage medium 104 can include a semiconductor or solid-state memory, a magnetic tape, a removable computer diskette, a random-access memory (RAM), a read-only memory (ROM), a rigid magnetic disk, and/or an optical disk. In some embodiments using optical disks, the computer-readable storage medium 104 can include a compact disk read only memory (CD-ROM), a compact disk read/write memory (CD-R/W), and/or a digital video disc (DVD).

In some embodiments, the computer-readable storage medium 104 stores computer program code or instructions 106 configured to cause the system 100 to perform a portion or all the functions of the system 100. In some embodiments, the computer-readable storage medium 104 also stores information which facilitates performing a portion or all the functions of the system 100. In some embodiments, the computer-readable storage medium 104 stores a database 118 that includes one or more of component libraries, digital circuit cell libraries, and databases.

The system 100 includes the I/O interface 112, which is coupled to external circuitry. In some embodiments, the I/O interface 112 includes a keyboard, keypad, mouse, trackball, trackpad, touchscreen, and/or cursor direction keys for communicating information and commands to the processor 102.

The network interface 114 is coupled to the processor 102 and allows the system 100 to communicate with the network 116, to which one or more other computer systems are connected. The network interface 114 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 100 can be performed in two or more systems that are like system 100.

The system 100 is configured to receive information through the I/O interface 112. The information received through the I/O interface 112 includes one or more of instructions, data, design rules, libraries of components and cells, and/or other parameters for processing by the processor 102. The information is transferred to the processor 102 by the bus 110. Also, the system 100 is configured to receive information related to a user interface (UI) through the I/O interface 112. This UI information can be stored in the computer-readable storage medium 104 as a UI 120.

In some embodiments, a portion or all the functions of the system 100 are implemented via a standalone software application for execution by a processor. In some embodiments, a portion or all the functions of the system 100 are implemented in a software application that is a part of an additional software application. In some embodiments, a portion or all the functions of the system 100 are implemented as a plug-in to a software application. In some embodiments, at least one of the functions of the system 100 is implemented as a software application that is a portion of an EDA tool. In some embodiments, a portion or all the functions of the system 100 are implemented as a software application that is used by the system 100. In some embodiments, a layout diagram is generated using a tool such as VIRTUOSO available from CADENCE DESIGN SYSTEMS, Inc., or another suitable layout generating tool.

In some embodiments, the routing, layouts, and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a digital video disc or a digital versatile disc (DVD), a magnetic disk such as a hard disk, a semiconductor memory such as a ROM and a RAM, and a memory card, and the like.

As noted above, embodiments of the system 100 include fabrication tools 108 for implementing the manufacturing processes of the system 100. For example, based on the final layout, photolithographic masks may be generated, which are used to fabricate the semiconductor device by the fabrication tools 108.

Figure 3:
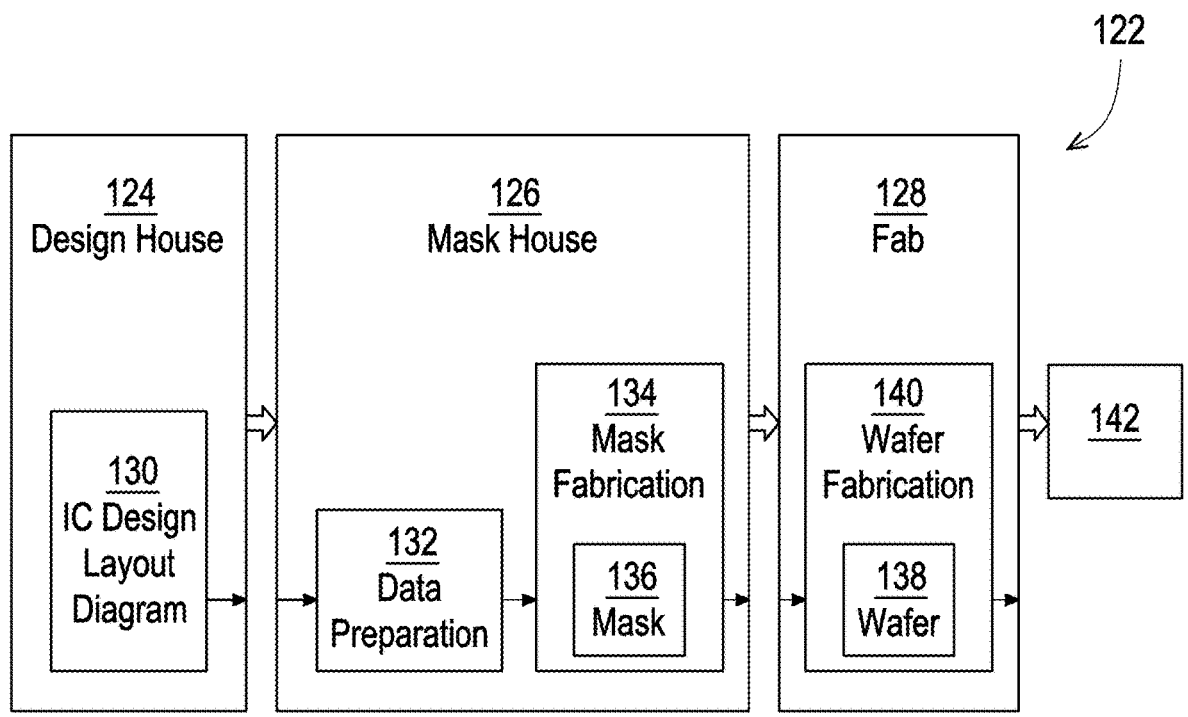
FIG. 3 is a block diagram of a semiconductor device manufacturing system and a semiconductor device manufacturing flow associated therewith, in accordance with some embodiments.

Further aspects of device fabrication are disclosed in conjunction with FIG. 3, which is a block diagram of a semiconductor device manufacturing system 122 and a semiconductor device manufacturing flow associated therewith, in accordance with some embodiments. In some embodiments, based on a layout diagram, one or more semiconductor masks and/or at least one component in a layer of a semiconductor device is fabricated using the manufacturing system 122.

In FIG. 3, the semiconductor device manufacturing system 122 includes entities, such as a design house 124, a mask house 126, and a semiconductor device manufacturer/fabricator ("Fab") 128, that interact with one another in the design, development, and manufacturing cycles and/or services related to manufacturing a semiconductor device, such as the semiconductor devices described herein. The entities in the system 122 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 124, the mask house 126, and the semiconductor device fab 128 are owned by a single larger company. In some embodiments, two or more of the design house 124, the mask house 126, and the semiconductor device fab 128 coexist in a common facility and use common resources.

The design house (or design team) 124 generates a semiconductor device design layout diagram 130. The semiconductor device design layout diagram 130 includes various geometrical patterns, or semiconductor device layout diagrams designed for a semiconductor device. The geometrical patterns correspond to patterns of metal, oxide, or semiconductor layers that make up the various components of the semiconductor structures to be fabricated. The various layers combine to form various semiconductor device features. For example, a portion of the semiconductor device design layout diagram 130 includes various semiconductor device features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 124 implements a design procedure to form a semiconductor device design layout diagram 130. The semiconductor device design layout diagram 130 is presented in one or more data files having information of the geometrical patterns. For example, semiconductor device design layout diagram 130 can be expressed in a GDSII file format or DFII file format. In some embodiments, the design procedure includes one or more of analog circuit design, digital circuit design, logic circuit design, standard cell circuit design, power distribution network (PDN) design including power via design, supply voltage track design, reference voltage track design, place and route routines, and physical layout designs.

The mask house 126 includes data preparation 132 and mask fabrication 134. The mask house 126 uses the semiconductor device design layout diagram 130 to manufacture one or more masks 136 to be used for fabricating the various layers of the semiconductor device or semiconductor structure. The mask house 126 performs mask data preparation 132, where the semiconductor device design layout diagram 130 is translated into a representative data file (RDF). The mask data preparation 132 provides the RDF to the mask fabrication 134. The mask fabrication 134 includes a mask writer that converts the RDF to an image on a substrate, such as a mask (reticle) 136 or a semiconductor wafer 138. The design layout diagram 130 is manipulated by the mask data preparation 132 to comply with characteristics of the mask writer and/or criteria of the semiconductor device fab 128. In FIG. 3, the mask data preparation 132 and the mask fabrication 134 are illustrated as separate elements. In some embodiments, the mask data preparation 132 and the mask fabrication 134 can be collectively referred to as mask data preparation.

In some embodiments, the mask data preparation 132 includes an optical proximity correction (OPC) which uses lithography enhancement techniques to compensate for image errors, such as those that can arise from diffraction, interference, other process effects and the like. The OPC adjusts the semiconductor device design layout diagram 130. In some embodiments, the mask data preparation 132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 132 includes a mask rule checker (MRC) that checks the semiconductor device design layout diagram 130 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the semiconductor device design layout diagram 130 to compensate for limitations during the mask fabrication 134, which may undo part of the modifications performed by OPC to meet mask creation rules.

In some embodiments, the mask data preparation 132 includes lithography process checking (LPC) that simulates processing that will be implemented by the semiconductor device fab 128. LPC simulates this processing based on the semiconductor device design layout diagram 130 to create a simulated manufactured device. The processing parameters in LPC simulation can include parameters associated with various processes of the semiconductor device manufacturing cycle, parameters associated with tools used for manufacturing the semiconductor device, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the semiconductor device design layout diagram 130.

The above description of mask data preparation 132 has been simplified for the purposes of clarity. In some embodiments, data preparation 132 includes additional features such as a logic operation (LOP) to modify the semiconductor device design layout diagram 130 according to manufacturing rules. Additionally, the processes applied to the semiconductor device design layout diagram 130 during data preparation 132 may be executed in a variety of different orders.

After the mask data preparation 132 and during the mask fabrication 134, a mask 136 or a group of masks 136 are fabricated based on the modified semiconductor device design layout diagram 130. In some embodiments, the mask fabrication 134 includes performing one or more lithographic exposures based on the semiconductor device design layout diagram 130. In some embodiments, an electron-beam (e-beam) or a mechanism of multiple e-beams is used to form a pattern on a mask (photomask or reticle) 136 based on the modified semiconductor device design layout diagram 130. The mask 136 can be formed in various technologies. In some embodiments, the mask 136 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 136 includes a transparent substrate (e.g., fused quartz) and an opaque material (e.g., chromium) coated in the opaque regions of the binary mask. In another example, the mask 136 is formed using a phase shift technology. In a phase shift mask (PSM) version of the mask 136, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 134 is used in a variety of processes. For example, such a mask(s) is used in an ion implantation process to form various doped regions in the semiconductor wafer 138, in an etching process to form various etching regions in the semiconductor wafer 138, and/or in other suitable processes.

The semiconductor device fab 128 includes wafer fabrication 140. The semiconductor device fab 128 is a semiconductor device fabrication business that includes one or more manufacturing facilities for the fabrication of a variety of different semiconductor device products. In some embodiments, the semiconductor device fab 128 is a semiconductor foundry. For example, there may be a manufacturing facility for the front end of line (FEOL) fabrication of a plurality of semiconductor device products, while a second manufacturing facility may provide the back end of line (BEOL) fabrication for the interconnection and packaging of the semiconductor device products, and a third manufacturing facility may provide other services for the foundry business.

The semiconductor device fab 128 uses the mask(s) 136 fabricated by the mask house 126 to fabricate the semiconductor structures or semiconductor devices 142 of the current disclosure. Thus, the semiconductor device fab 128 at least indirectly uses the semiconductor device design layout diagram 130 to fabricate the semiconductor structures or semiconductor devices 142 of the current disclosure. Also, the semiconductor wafer 138 includes a silicon substrate or other proper substrate having material layers formed thereon, and the semiconductor wafer 138 further includes one or more of various doped regions, dielectric features, multilevel interconnects, and the like (formed at subsequent manufacturing steps). In some embodiments, the semiconductor wafer 138 is fabricated by the semiconductor device fab 128 using the mask(s) 136 to form the semiconductor structures or semiconductor devices 142 of the current disclosure. In some embodiments, the semiconductor device fabrication includes performing one or more lithographic exposures based at least indirectly on the semiconductor device design layout diagram 130.

As disclosed above, the ring oscillator device 20 of FIG. 1 includes delay cells 22a-22n configured to reduce PN in the ring oscillator 20. In some embodiments, the ring oscillator 20 includes stacked gate delay cells in the delay cells 22a-22n. The stacked gate delay cells can have larger effective transistor channel areas that reduce the noise of the stacked gate delay cells and lowers the PN of the ring oscillator 20. In some embodiments, the stacked gate delay cells have larger effective transistor channel lengths and widths, i.e., larger effective transistor channel areas, and lower flicker noise current spectral densities.

Figure 4:
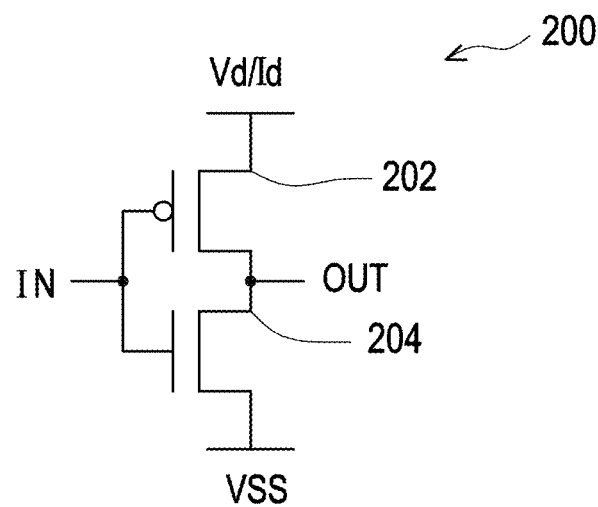
FIG. 4 is a diagram schematically illustrating a delay cell, in accordance with some embodiments.

FIG. 4 is a diagram schematically illustrating a delay cell 200, in accordance with some embodiments. The delay cell 200 is an inverter that includes one PMOS transistor 202 and one NMOS transistor 204. The delay cell 200 is referred to as a stacked gate delay cell #1, where the delay cell 200 includes one PMOS transistor 202 and one NMOS transistor 204. In some embodiments, one or more of the delay cells 22a-22n in the ring oscillator 20 is like the delay cell 200.

In the delay cell 200, one drain/source region of the PMOS transistor 202 is configured to receive a drain/source voltage/current Vd/Id and the other drain/source region of the PMOS transistor 202 is electrically connected to one drain/source region of the NMOS transistor 204 at the output of the delay cell 200. The other drain/source region of the NMOS transistor 204 is electrically connected to a reference Vss, such as ground. Thus, the drain/source path of the PMOS transistor 202 is electrically connected in series to the drain/source path of the NMOS transistor 204. Also, the gate of the PMOS transistor 202 is electrically connected to the gate of the NMOS transistor 204 at the input of the delay cell 200 and configured to receive the input signal IN. The delay cell 200 receives the input signal IN and inverts the input signal IN to provide an output signal OUT that is the inverse of the input signal IN.

Figure 5:
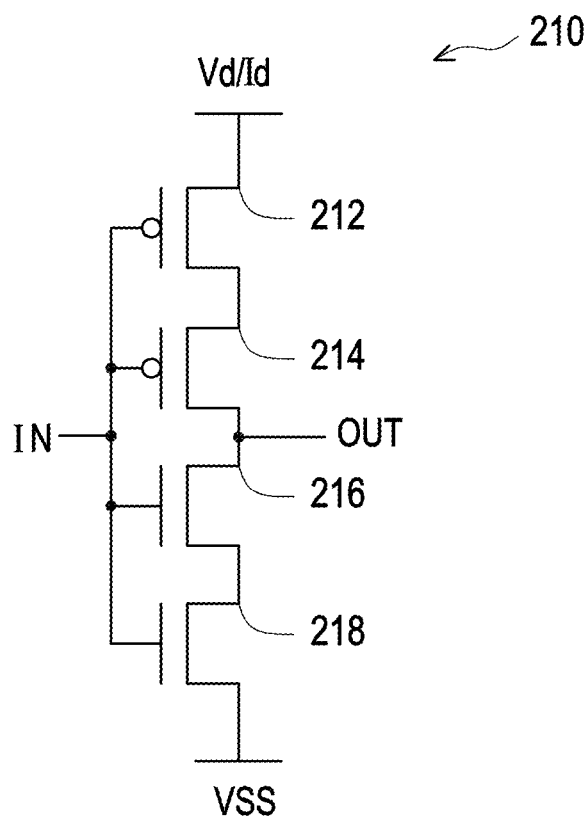
FIG. 5 is a diagram schematically illustrating another stacked gate delay cell, in accordance with some embodiments.

FIG. 5 is a diagram schematically illustrating another stacked gate delay cell 210, in accordance with some embodiments. The stacked gate delay cell 210 is an inverter that includes two PMOS transistors 212 and 214 and two NMOS transistors 216 and 218, such that the stacked gate delay cell 210 is referred to as a stacked gate delay cell #2 since it includes two PMOS transistors 212 and 214 and two NMOS transistors 216 and 218. In some embodiments, one or more of the delay cells 22a-22n, and up to all the delay cells 22a-22n, in the ring oscillator 20 is like the stacked gate delay cell 210.

In the stacked gate delay cell 210, one drain/source region of the PMOS transistor 212 is configured to receive a drain/source voltage/current Vd/Id and the other drain/source region of the PMOS transistor 212 is electrically connected to one drain/source region of the PMOS transistor 214. The other drain/source region of the PMOS transistor 214 is electrically connected to one drain/source region of the NMOS transistor 216 at the output of the stacked gate delay cell 210 and the other drain/source region of the NMOS transistor 216 is electrically connected to one drain/source region of the NMOS transistor 218. The other drain/ source region of the NMOS transistor 218 is electrically connected to a reference Vss, such as ground. Thus, the drain/source path of the PMOS transistor 212 is electrically connected in series with the drain/source path of the PMOS transistor 214, and the drain/source path of the NMOS transistor 216 is electrically connected in series with the drain/source path of the NMOS transistor 218. Also, the drain/source paths of the PMOS transistors 212 and 214 are electrically connected in series with the drain/source paths of the NMOS transistors 216 and 218 at the output of the stacked gate delay cell 210. In addition, the gates of the PMOS transistors 212 and 214 are electrically connected to each other and to the gates of the NMOS transistors 216 and 218 at the input of the stacked gate delay cell 210 and configured to receive the input signal IN. The delay cell 210 receives the input signal IN and inverts the input signal IN to provide the output signal OUT that is the inverse of the input signal IN.

Stacked gate delay cells are numbered to indicate the number of PMOS transistors and the number of NMOS transistors in the stacked gate delay cell. For example, the stacked gate delay cell 210, referred to as a stacked gate delay cell #2, includes two PMOS transistors 212 and 214 and two NMOS transistors 216 and 218 having drain/source paths electrically connected in series. Also, in further example embodiments, a stacked gate delay cell #3 includes three PMOS transistors and three NMOS transistors having drain/source paths electrically connected in series, such that the drain/source paths of the three PMOS transistors are electrically connected in series with each other and the drain/source paths of the three NMOS transistors are electrically connected in series with each other and to the drain/source paths of the three PMOS transistors at the output of the stacked gate delay cell. In addition, the gates of the three PMOS transistors and the gates of the three NMOS transistors are electrically connected at the input. This pattern continues in stacked gate delay cells #x that include x PMOS transistors and x NMOS transistors electrically connected in series, and so on.

In a stacked gate delay cell, the effective channel length and width, i.e., channel area, of the PMOS transistors is a function of the number of PMOS transistors in the stacked gated delay cell and the effective channel length and width, i.e., channel area, of the NMOS transistors is a function of the number of NMOS transistors in the stacked gated delay cell. For example, if the delay cell is a stacked gate delay cell #2, then the effective channel length and width, i.e., channel area, of the PMOS transistors is a function, such as a multiple, of two PMOS transistors and the effective channel length and width, i.e., channel area, of the NMOS transistors is a function, such as a multiple, of two NMOS transistors. The stacked gate delay cells with larger channel areas provide lower noise values and achieve lower PN in the ring oscillator.

Figure 6:
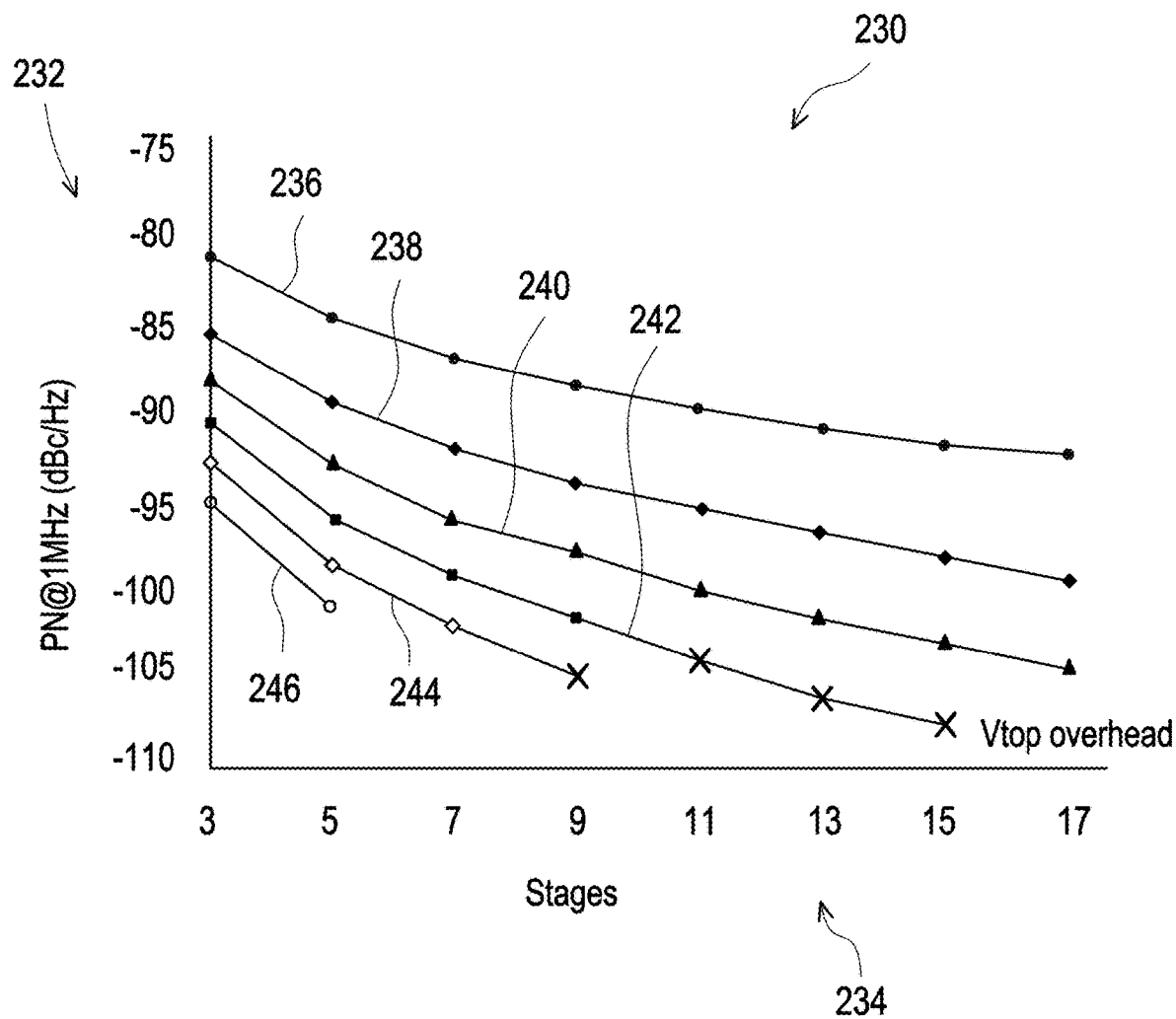
FIG. 6 is a diagram schematically illustrating a graph of the PN of the ring oscillator of FIG. 1 in relation to the number of delay cells in the ring oscillator and the stacked gate delay cell number used in the ring oscillator, in accordance with some embodiments.

FIG. 6 is a diagram schematically illustrating a graph 230 of the PN for the ring oscillator 20 of FIG. 1 in relation to the number of delay cells 22a-22n in the ring oscillator 20 and the stacked gate delay cell #x used in the ring oscillator 20, in accordance with some embodiments. The PN for the ring oscillator 20 is graphed for each of six different versions of the ring oscillator 20, where each version of the ring oscillator 20 includes a different stacked gate delay cell #x and all the delay cells 22a-22n in each version of the ring oscillator 20 include the same stacked gate delay cell #x. The ring oscillator PN at 1 megahertz (MHZ) from the carrier frequency is indicated in decibels relative to the carrier per hertz (dBc/Hz) along the y-axis 232 and the number of stages or delay cells 22a-22n in the ring oscillator 20 is indicated along the x-axis 234.

For each of the six different versions of the ring oscillator 20, the PN at 1 MHz decreases with an increase in the number (an odd number) of delay cells 22a-22n in the ring oscillator 20 from 3 delay cells 22a-22n to 17 delay cells 22a-22n. Also, the PN at 1 MHZ decreases with an increase in the stacked gate delay cell number from stacked gate delay cell #1 to stacked gated cell #6. Where, the PN at 1 MHz for the ring oscillator 20 with stacked gate delay cell #1 is indicated at line 236, the PN at 1 MHz for the ring oscillator 20 with stacked gate delay cell #2 is indicated at line 238, the PN at 1 MHz for the ring oscillator 20 with stacked gate delay cell #3 is indicated at line 240, the PN at 1 MHz for the ring oscillator 20 with stacked gate delay cell #4 is indicated at line 242, the PN at 1 MHz for the ring oscillator 20 with stacked gate delay cell #5 is indicated at line 244, and the PN at 1 MHz for the ring oscillator 20 with stacked gate delay cell #6 is indicated at line 246.

In some embodiments, the current Id is provided to the delay cells 22a-22n and an overhead voltage Vtop overhead is used by the delay cells 22a-22n. Stacked gate delay cells that include more transistors have a higher resistance, such that the overhead voltage Vtop overhead may be very high. As a result, in some embodiments, the number of delay cells 22a-22n is limited to nine in the ring oscillator 20 having stacked gate delay cell #4, the number of delay cells 22a-22n is limited to seven in the ring oscillator 20 having stacked gate delay cell #5, and the number of delay cells 22a-22n is limited to five in the ring oscillator 20 having stacked gate delay cell #6.

Figure 7:
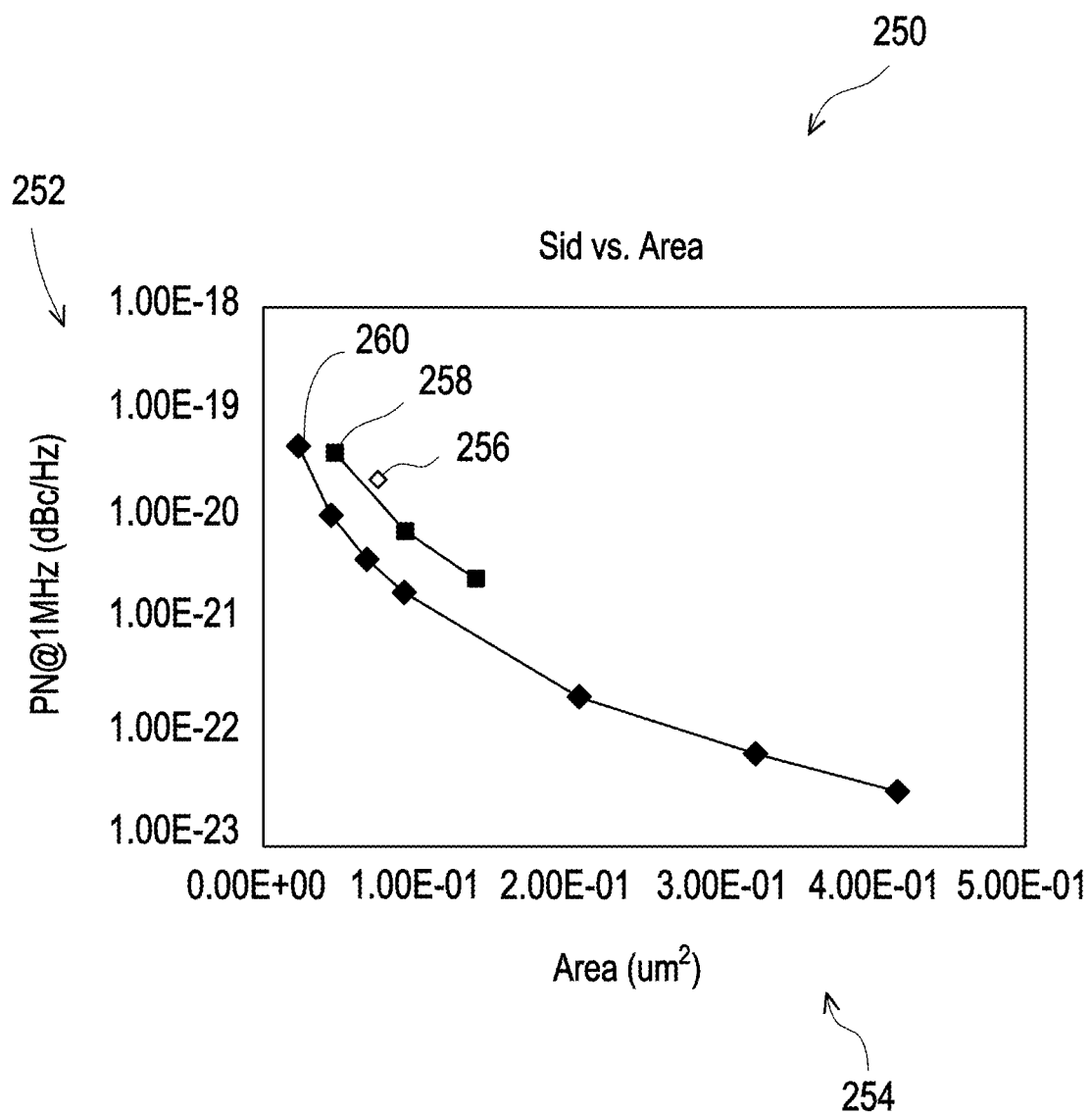
FIG. 7 is a diagram schematically illustrating a graph of the spectral density (SiD) of the noise of the ring oscillator of FIG. 1 in relation to the effective channel area of the transistors in the delay cells, in accordance with some embodiments.

FIG. 7 is a diagram schematically illustrating a graph 250 of the SiD of the noise of the ring oscillator 20 of FIG. 1 in relation to the effective channel area of the transistors in the delay cells 22a-22n, in accordance with some embodiments. The SiD of the noise of the ring oscillator 20 is graphed for each of three different versions of the ring oscillator 20. Each version of the ring oscillator 20 has transistors with a different channel length, including a 3 nanometer (nm) channel length, a 14 nm channel length, and a 55 nm channel length, where all the delay cells 22a-22n in each version of the ring oscillator 20 include the same channel length. The ring oscillator SiD at 1 MHz from the carrier frequency is indicated along the y-axis 252 and the channel area in micrometers squared (um2) is indicated along the x-axis 254.

In a stacked gate delay cell #1, the SiD of the noise at point 256 with delay cells 22a-22n that have transistors with a 55 nm channel length is less than the SiD of the noise at point 258 with delay cells 22a-22n that have transistors with a 14 nm channel length that is less than the SiD of the noise at point 260 with delay cells 22a-22n that have transistors with a 3 nm channel length. Also, as the stacked gate delay cell #x is increased to stacked gate delay cell #2 (STG=2), and stacked gate delay cell #3 (STG=3), and so on, the effective channel area of the transistors increases and the SiD of the noise decreases.

Figure 8:
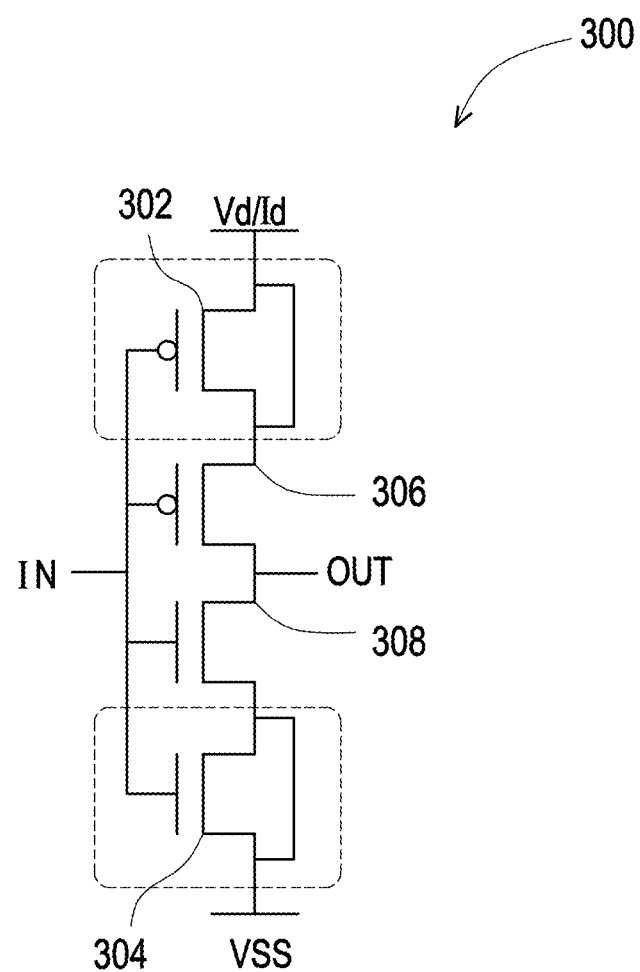
FIG. 8 is a diagram schematically illustrating a stacked gate delay cell that includes a PMOS pseudo load transistor and an NMOS pseudo load transistor, in accordance with some embodiments.

FIG. 8 is a diagram schematically illustrating a stacked gate delay cell 300 that includes a PMOS pseudo load transistor 302 and an NMOS pseudo load transistor 304, in accordance with some embodiments. The stacked gate delay cell 300, with the PMOS pseudo load transistor 302 and the NMOS pseudo load transistor 304, receives a larger current Id that reduces the normalized spectral density SiD/Id2 of the stacked gate delay cell 300 and reduces the rise and fall times of the stacked gate delay cell 300, while in a ring oscillator 20 maintaining the target frequency of the ring oscillator 20. Also, the reduced normalized spectral density SiD/Id2 of the stacked gate delay cell 300 and the reduced rise and fall time of the stacked gate delay cell 300 results in a lower PN of the ring oscillator 20. In some embodiments, one or more of the delay cells 22a-22n, and up to all the delay cells 22a-22n, in the ring oscillator 20 is like the stacked gate delay cell 300.

The stacked gate delay cell 300 is an inverter that includes one PMOS transistor 306 and one NMOS transistor 308, such that the stacked gate delay cell 300 is referred to as a stacked gate delay cell #1, since it includes the one PMOS transistor 306 and the one NMOS transistor 308. The stacked gate delay cell 300 further includes the PMOS pseudo load transistor 302 and the NMOS pseudo load transistor 304.

In the stacked gate delay cell 300, the drain/source regions of the PMOS pseudo load transistor 302 are connected to each other with one end of the PMOS pseudo load transistor 302 connected to receive a drain/source voltage/current Vd/Id and the other end of the PMOS pseudo load transistor 302 electrically connected to one drain/source region of the PMOS transistor 306. The other drain/source region of the PMOS transistor 306 is electrically connected to one drain/source region of the NMOS transistor 308 at the output of the stacked gate delay cell 300 and the other drain/source region of the NMOS transistor 308 is electrically connected to the drain/source regions of the NMOS pseudo load transistor 304, where the drain/source regions of the NMOS pseudo load transistor 304 are connected to each other and electrically connected to a reference Vss, such as ground. Thus, the drain/source path of the PMOS transistor 306 is electrically connected in series with the PMOS pseudo load transistor 302 and the drain/source path of the NMOS transistor 308 that is electrically connected in series to the NMOS pseudo load transistor 302. In addition, the gates of the PMOS pseudo load transistor 302 and the NMOS pseudo load transistor 304 are electrically connected to each other and to the gates of the PMOS transistor 306 and the NMOS transistor 308 and configured to receive the input signal IN. The stacked gate delay cell 300 receives the input signal IN and inverts the input signal IN to provide the output signal OUT that is the inverse of the input signal IN.

In other embodiments, the PMOS pseudo load transistor 302 and the NMOS pseudo load transistor 304 are electrically connected to stacked gate delay cells having a different number of transistors, such as a stacked gate delay cell #2, a stacked gate delay cell #3, and so on, to achieve a reduced normalized spectral density SiD/Id2 of the stacked gate delay cell and reduced rise and fall times of the stacked gate delay cell in the delay cells 22a-22n of the ring oscillator 20 and provide a lower PN of the ring oscillator 20.

Figure 9:
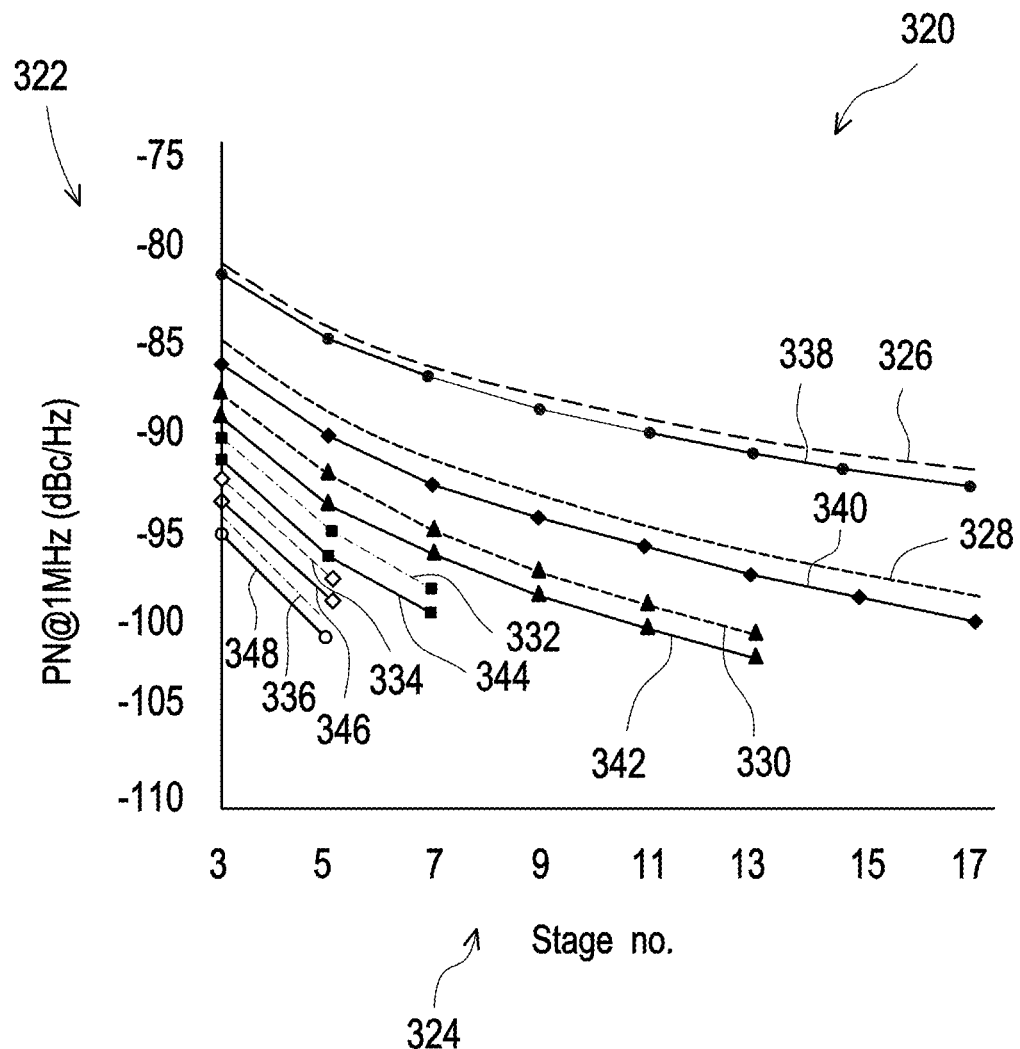
FIG. 9 is a diagram schematically illustrating a graph of the PN of the ring oscillator of FIG. 1 in relation to the number of delay cells, i.e., the number of stages, in the ring oscillator for each of twelve different versions of the ring oscillator, in accordance with some embodiments.

FIG. 9 is a diagram schematically illustrating a graph 320 of the PN of the ring oscillator 20 of FIG. 1 in relation to the number of delay cells 22a-22n, i.e., the number of stages, in the ring oscillator 20 for each of twelve different versions of the ring oscillator 20, in accordance with some embodiments. Each version of the ring oscillator 20 includes one of the stacked gate delay cells #1-#6 without pseudo load transistors 302 and 304 or one of the stacked gate delay cells #1-#6 with pseudo load transistors 302 and 304, where all the delay cells 22a-22n in a version of the ring oscillator 20 include the same stacked gate delay cell #x without pseudo load transistors 302 and 304 or the same stacked gate delay cell #x with pseudo load transistors 302 and 304. The PN for the ring oscillator 20 is graphed for each version of the ring oscillator 20. The ring oscillator PN at 1 MHz from the carrier frequency is indicated in dBc/Hz along the y-axis 322 and the number of delay cells 22a-22n or stages in the ring oscillator 20 is indicated along the x-axis 324.

For each of the twelve different versions of the ring oscillator 20, the PN at 1 MHz decreases with an increase in the number (an odd number) of delay cells 22a-22n in the ring oscillator 20, from 3 delay cells 22a-22n up to 17 delay cells 22a-22n. Also, the PN at 1 MHZ decreases with an increase in the stacked gate delay cell #x, from stacked gate delay cell #1 to stacked gated delay cell #6. For example, the PN at 1 MHz for the ring oscillator 20 with stacked gate delay cell #1 and without pseudo load transistors 302 and 304 indicated at line 326 is greater than the PN at 1 MHz for the ring oscillator 20 with stacked gate delay cell #2 and without pseudo load transistors 302 and 304 indicated at line 328, which is greater than the PN at 1 MHz for the ring oscillator 20 with stacked gate delay cell #3 and without pseudo load transistors 302 and 304 indicated at line 330, which is greater than the PN at 1 MHz for the ring oscillator 20 with stacked gate delay cell #4 and without pseudo load transistors 302 and 304 indicated at line 332, which is greater than the PN at 1 MHz for the ring oscillator 20 with stacked gate delay cell #5 and without pseudo load transistors 302 and 304 indicated at line 334, which is greater than the PN at 1 MHz for the ring oscillator 20 with stacked gate delay cell #6 and without pseudo load transistors 302 and 304 indicated at line 336.

In addition, the PN at 1 MHZ decreases with the addition of pseudo load transistors 302 and 304 to the stacked gate delay cell #x for each of the versions of the ring oscillator 20. The PN at 1 MHz for the ring oscillator 20 with stacked gate delay cell #1 and with pseudo load transistors 302 and 304 indicated at line 338 is less than the PN at 1 MHz for the ring oscillator 20 with stacked gate delay cell #1 and without pseudo load transistors 302 and 304 indicated at line 326, the PN at 1 MHz for the ring oscillator 20 with stacked gate delay cell #2 and with pseudo load transistors 302 and 304 indicated at line 340 is less than the PN at 1 MHz for the ring oscillator 20 with stacked gate delay cell #2 and without pseudo load transistors 302 and 304 indicated at line 328, the PN at 1 MHz for the ring oscillator 20 with stacked gate delay cell #3 and with pseudo load transistors 302 and 304 indicated at line 342 is less than the PN at 1 MHz for the ring oscillator 20 with stacked gate delay cell #3 and without pseudo load transistors 302 and 304 indicated at line 330, the PN at 1 MHz for the ring oscillator 20 with stacked gate delay cell #4 and with pseudo load transistors 302 and 304 indicated at line 344 is less than the PN at 1 MHz for the ring oscillator 20 with stacked gate delay cell #4 and without pseudo load transistors 302 and 304 indicated at line 332, the PN at 1 MHz for the ring oscillator 20 with stacked gate delay cell #5 and with pseudo load transistors 302 and 304 indicated at line 346 is less than the PN at 1 MHz for the ring oscillator 20 with stacked gate delay cell #5 and without pseudo load transistors 302 and 304 indicated at line 334, and the PN at 1 MHz for the ring oscillator 20 with stacked gate delay cell #6 and with pseudo load transistors 302 and 304 indicated at line 348 is less than the PN at 1 MHz for the ring oscillator 20 with stacked gate delay cell #6 and without pseudo load transistors 302 and 304 indicated at line 336. Also, the PN at 1 MHZ decreases with an increase in the stacked gate delay cell #x and with pseudo load transistors 302 and 304, from stacked gate delay cell #1 to stacked gated delay cell #6.

The PMOS pseudo load transistor 302 and the NMOS pseudo load transistor 304 are electrically connected to stacked gate delay cells #1-#6 to achieve a reduced normalized spectral density SiD/Id2 of the stacked gate delay cells and reduced rise and fall times of the stacked gate delay cells and provide a lower PN of the ring oscillator 20.

Figure 10:
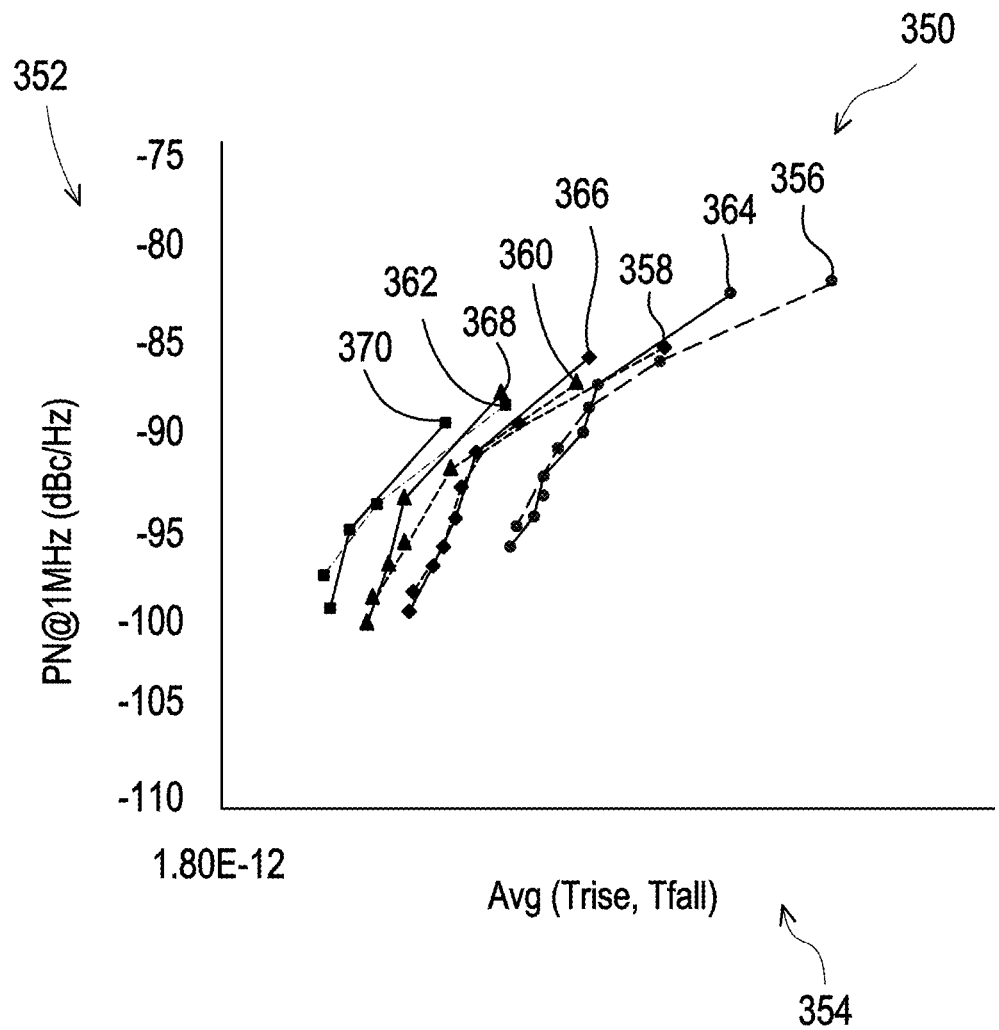
FIG. 10 is a diagram schematically illustrating a graph of the PN of the ring oscillator of FIG. 1 in relation to the average rise and fall times of the delay cells in the ring oscillator, in accordance with some embodiments.

FIG. 10 is a diagram schematically illustrating a graph 350 of the PN of the ring oscillator 20 of FIG. 1 in relation to the average rise and fall times (Trise and Tfall) of the delay cells 22a-22n in the ring oscillator 20, in accordance with some embodiments. Eight different versions of the ring oscillator 20 are graphed including two versions of the ring oscillator 20, one version without pseudo load transistors 302 and 304 and one version with pseudo load transistors 302 and 304, for each of four different number of delay cells 22a-22n in the ring oscillator 20 including 3 delay cells 22a-22n, 5 delay cells 22a-22n, 7 delay cells 22a-22n, and 9 delay cells 22a-22n. The ring oscillator PN at 1 MHz from the carrier frequency is indicated in dBc/Hz along the y-axis 352 and the average rise and fall times of the delay cells 22a-22n in the ring oscillator 20 are indicated along the x-axis 354.

The PN at 1 MHz decreases with the average rise and fall times of the delay cells 22a-22n in the ring oscillator 20. The PN at 1 MHz in a ring oscillator 20 having 3 delay cells 22a-22n without pseudo load transistors 302 and 304 indicated at line 356 is higher than the PN at 1 MHz in a ring oscillator 20 having 5 delay cells 22a-22n without pseudo load transistors 302 and 304 indicated at line 358, which is higher than the PN at 1 MHz in a ring oscillator 20 having 7 delay cells 22a-22n without pseudo load transistors 302 and 304 indicated at line 360, which is higher than the PN at 1 MHz in a ring oscillator 20 having 9 delay cells 22a-22n without pseudo load transistors 302 and 304 indicated at line 362. The PN at 1 MHz decreases as the average rise and fall times of the delay cells 22a-22n decrease in the ring oscillator 20.

Also, the PN at 1 MHz in a ring oscillator 20 having 3 delay cells 22a-22n with pseudo load transistors 302 and 304 indicated at line 364 is higher than the PN at 1 MHz in a ring oscillator 20 having 5 delay cells 22a-22n with pseudo load transistors 302 and 304 indicated at line 366, which is higher than the PN at 1 MHz in a ring oscillator 20 having 7 delay cells 22a-22n with pseudo load transistors 302 and 304 indicated at line 368, which is higher than the PN at 1 MHz in a ring oscillator 20 having 9 delay cells 22a-22n with pseudo load transistors 302 and 304 indicated at line 370. The PN at 1 MHz decreases with the average rise and fall times of the delay cells 22a-22n in the ring oscillator 20, and the PN at 1 MHz decreases when the delay cells 22a-22n in the ring oscillator 20 include pseudo load transistors 302 and 304.

FIG. 11 is a diagram schematically illustrating characteristics of three different ring oscillators (ROs), in accordance with some embodiments. Each of the three ring oscillators is like the ring oscillator 20 of FIG. 1. The three ring oscillators include a ring oscillator with 5 delay cells 22a-22n, i.e., stages, that are each a stacked gate delay cell #4 without pseudo load transistors in column 380, a ring oscillator with 9 delay cells 22a-22n that are each a stacked gate delay cell #4 without pseudo load transistors in column 382, and a ring oscillator with 9 delay cells 22a-22n that are each a stacked gate delay cell #4 with pseudo load (PL) transistors, such as the PMOS pseudo load transistor 302 and the NMOS pseudo load transistor 304 (shown in FIG. 8) in column 384. The frequency of each of the three ring oscillators is about 3 gigahertz (GHz), as indicated in corner 386.

The characteristics of the ring oscillators include the Id current in milliamps (mA) in row 388a, the overhead voltage Vtop in millivolts (mV) in row 388b, the rise/fall times of the delay cells 22a-22n in picoseconds (ps) in row 388c, the PN at 1 MHz of the ring oscillator in decibels (dB) in row 388d, and the FoM at 1 MHZ in row 388e. Where the FoM is a quantity used to characterize the performance of a device, system, or method relative to its alternatives. In some embodiments, the FoM is indicated in Equation 1 below.

$$FOM = L_{VCO}(\Delta\omega) - 20\log_{10}\left[\frac{\omega_0}{\Delta\omega}\right] + 10\log_{10}\left[\frac{P}{1\text{mW}}\right] \quad \text{Equation 1}$$

Where Lvco is a first noise number, $\Delta\omega$ is the distance from the primary oscillation frequency, $\omega_0$ is the primary oscillation frequency, and P is the power (per 1 milliwatt (mW)).

The ring oscillator in column 382 has 9 delay cells 22a-22n as compared to the ring oscillator in column 380 that has 5 delay cells 22a-22n, where both have stacked gate delay cell #4. As a result of the different number of delay cells 22a-22n in the ring oscillators, the ring oscillator in column 382 has a larger Id current of 3.8 mA and a larger overhead voltage Vtop of 666.2 mV as compared to the ring oscillator in column 380 that has a smaller Id current of 1.3 mA and a smaller voltage of 444.4 mV. Also, the ring oscillator in column 382 has shorter rise/fall times of 10.5/11.4 ps and a lower PN of −98.8 dB as compared to the ring oscillator in column 380 that has longer rise/fall times of 17.7/18.5 ps and a higher PN of −89.54 dB, such that the decrease in the PN is −9.3 dB from the ring oscillator in column 380 to the ring oscillator in column 382. In addition, the FoM of the ring oscillator in column 382 of −163.3 is greater than the FoM of the ring oscillator in column 380 of −160.4.

Further, the ring oscillator in column 384 has 9 delay cells 22a-22n with pseudo load transistors, such as PMOS pseudo load transistor 302 and NMOS pseudo load transistor 304 (shown in FIG. 8), as compared to the ring oscillator in column 382 that has 9 delay cells 22a-22n without pseudo load transistors, where both have stacked gate delay cell #4. As a result of the pseudo load transistors, the ring oscillator in column 384 has a larger Id current of 5.4 mA and a larger overhead voltage Vtop of 767.4 mV as compared to the ring oscillator in column 382 that has a smaller Id current of 3.8 mA and a smaller voltage of 662.2 mA. Also, the ring oscillator in column 384 has shorter rise/fall times of 9.8/10.9 ps and a lower PN of −101.8 dB as compared to the ring oscillator in column 382 that has longer rise/fall times of 10.5/11.4 and a higher PN of −98.8, such that the decrease in the PN is −3.0 dB from the ring oscillator in column 382 to the ring oscillator in column 384. The FoM of the ring oscillator in column 384 of −164.0 is greater than the FoM of the ring oscillator in column 382 of −163.3. Thus, the pseudo load transistors reduce PN and enhance or increase the FoM.

Figure 12:
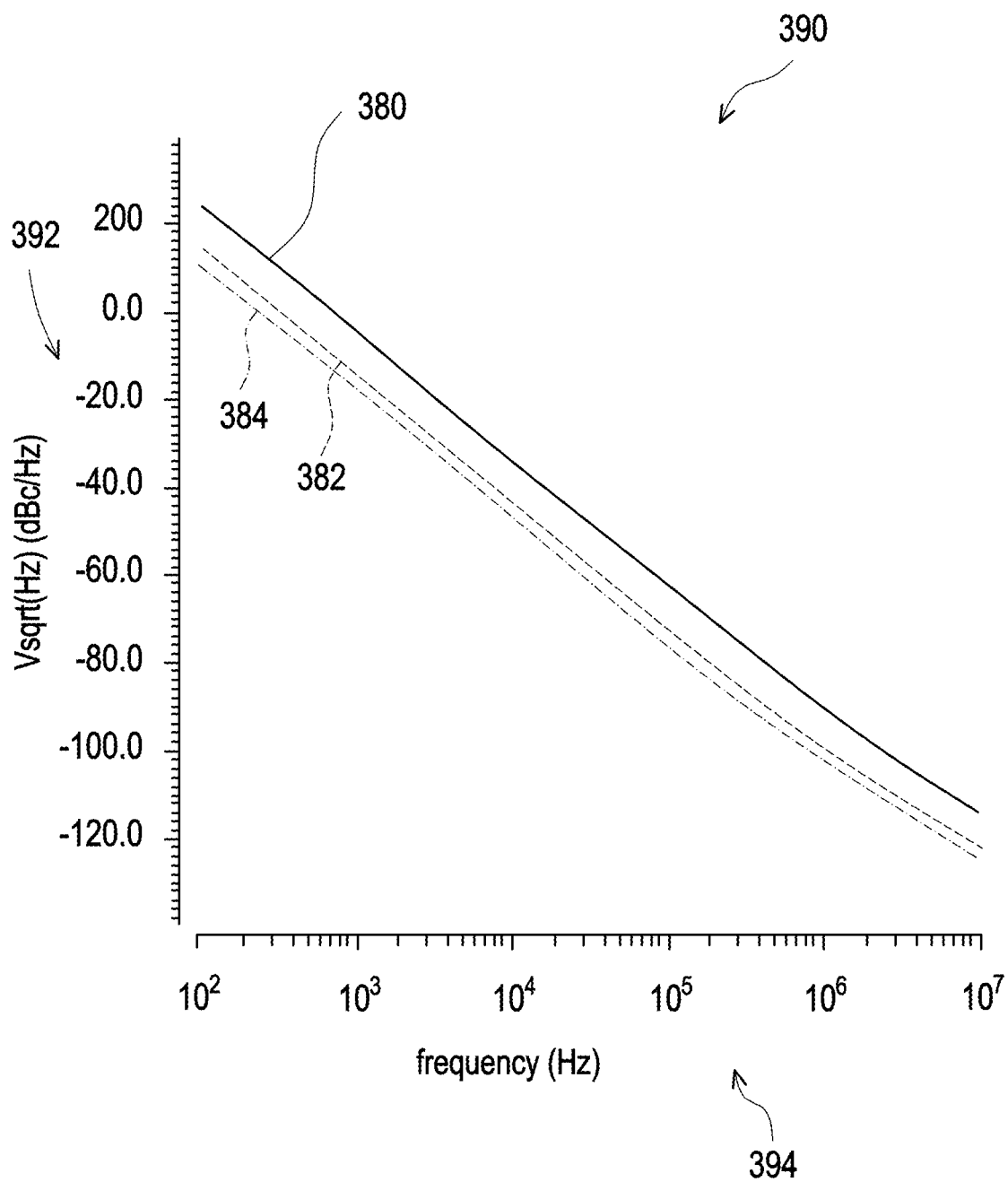
FIG. 12 is a diagram schematically illustrating a graph of the PN of ring oscillators in relation to the frequency of the ring oscillators, in accordance with some embodiments.

FIG. 12 is a diagram schematically illustrating a graph 390 of the PN of the ring oscillators in columns 380, 382, and 384 of FIG. 11 in relation to the frequency of the ring oscillators, in accordance with some embodiments. The PN of volts per square root hertz in dBc/Hz is indicated along the y-axis 392 and the frequency in hertz (Hz) is indicated along the x-axis 394.

The ring oscillator in column 380 has the highest PN of the three ring oscillators of FIG. 11 across all frequencies and the ring oscillator in column 384 has the lowest PN of the three ring oscillators of FIG. 11 across all frequencies. The ring oscillator in column 382 has a PN that is between the PN of the ring oscillator in column 380 and the PN of the ring oscillator in column 384 across all frequencies.

Figure 13:
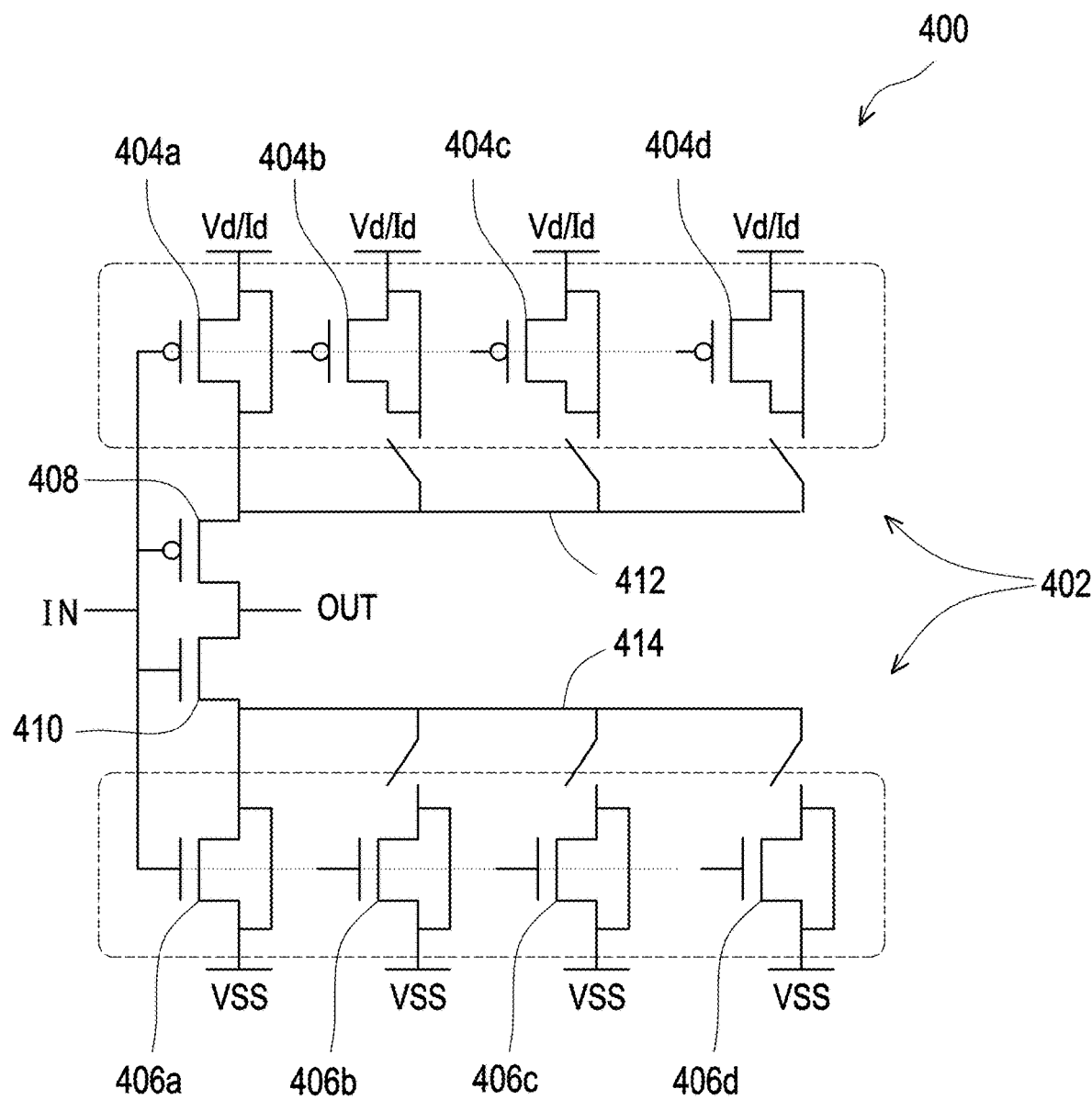
FIG. 13 is a diagram schematically illustrating a stacked gate delay cell that includes a programmable pseudo load circuit, in accordance with some embodiments.

FIG. 13 is a diagram schematically illustrating a stacked gate delay cell 400 that includes a programmable pseudo load circuit 402, in accordance with some embodiments. The programmable pseudo load circuit 402 includes four PMOS pseudo load transistors 404a-404d and four NMOS pseudo load transistors 406a-406d. The PMOS pseudo load transistors 404a-404d are configured to be connected to each other in parallel and the NMOS pseudo load transistors 406a-406d are configured to be connected to each other in parallel. In some embodiments, one or more of the delay cells 22a-22n, and up to all the delay cells 22a-22n, in the ring oscillator 20 are like the stacked gate delay cell 400. In other embodiments, the programmable pseudo load circuit 402 includes more or less than four PMOS pseudo load transistors 404a-404d. In other embodiments, the programmable pseudo load circuit 402 includes more or less than four NMOS pseudo load transistors 406a-406d.

The stacked gate delay cell 400 is an inverter that includes one PMOS transistor 408 and one NMOS transistor 410, such that the stacked gate delay cell 400 is referred to as a stacked gate delay cell #1. Also, the stacked gate delay cell 400 includes the programmable pseudo load circuit 402 with the PMOS pseudo load transistor 404a connected to the PMOS transistor 408 and the NMOS pseudo load transistor 406a connected to the NMOS transistor 410. The other PMOS pseudo load transistors 404b-404d are individually selectively electrically connected into the stacked gate delay cell 400 by first control bits 412 and the other NMOS pseudo load transistors 406b-406d are individually selectively electrically connected into the stacked gate delay cell 400 by second control bits 414.

The stacked gate delay cell 400 with the programmable pseudo load circuit 402 can be programmed to include one PMOS pseudo load transistor 404a and up to all four PMOS pseudo load transistors 404a-404d and to include one NMOS pseudo load transistor 404a and up to all four NMOS pseudo load transistors 404a-404d. The current Id received by the stacked gate delay cell 400 is adjusted based on the number of pseudo load transistors 404a-404d and 406a-406d included in the stacked gate delay cell 400. The current Id received by the stacked gate delay cell 400 is adjusted to target a normalized spectral density SiD/Id2 and rise and fall times of the delay cells 22a-22n in the ring oscillator 20 and, thus, provide a target PN of the ring oscillator 20 and a target oscillation frequency of the ring oscillator 20.

In the stacked gate delay cell 400, the drain/source regions of each of the PMOS pseudo load transistors 404a-404d are electrically connected to each other with one end of each of the PMOS pseudo load transistors 404a-404d electrically connected to receive a voltage/current Vd/Id. The other end of the PMOS pseudo load transistor 404a is electrically connected to one drain/source region of the PMOS transistor 408, and the other ends of each of the PMOS pseudo load transistors 404b-404d are individually selectively electrically connected to the one drain/source region of the PMOS transistor 408 by first control bits 412. The other drain/source region of the PMOS transistor 408 is electrically connected to one drain/source region of the NMOS transistor 410 at the output of the stacked gate delay cell 400 and the other drain/source region of the NMOS transistor 410 is electrically connected to the drain/source regions of the NMOS pseudo load transistor 406a. The other NMOS pseudo load transistors 406b-406d are individually selectively electrically connected to the drain/source region of the NMOS transistor 410 by second control bits 414, where the drain/source regions of each of the NMOS pseudo load transistor 406a-406d are electrically connected to each other and electrically connected to a reference Vss, such as ground.

Thus, the drain/source path of the PMOS transistor 408 is electrically connected in series with the PMOS pseudo load transistor 404a and, optionally, with up to all four of the PMOS pseudo load transistors 404a-404d, and to the drain/source path of the NMOS transistor 410 that is electrically connected in series to the NMOS pseudo load transistor 406a and, optionally, up to all four of the NMOS pseudo load transistors 406a-406d. In addition, the gates of the PMOS pseudo load transistors 404a-404d, the gates of the NMOS pseudo load transistors 406a-406d, the gate of the PMOS transistor 408, and the gate of the NMOS transistor 410 are electrically connected to each other and configured to receive the input signal IN. The stacked gate delay cell 400 receives the input signal IN and inverts the input signal IN to provide the output signal OUT that is the inverse of the input signal IN.

In other embodiments, the programmable pseudo load circuit 402 is part of a stacked gate delay cell having a different number of transistors, such as a stacked gate delay cell #2, a stacked gate delay cell #3, and so on, to reduce and target a normalized spectral density SiD/Id2 and rise and fall times of the delay cells 22a-22n in the ring oscillator 20 and, thus, provide a lower targeted PN of the ring oscillator 20 and a target oscillation frequency of the ring oscillator 20.

Figure 14:
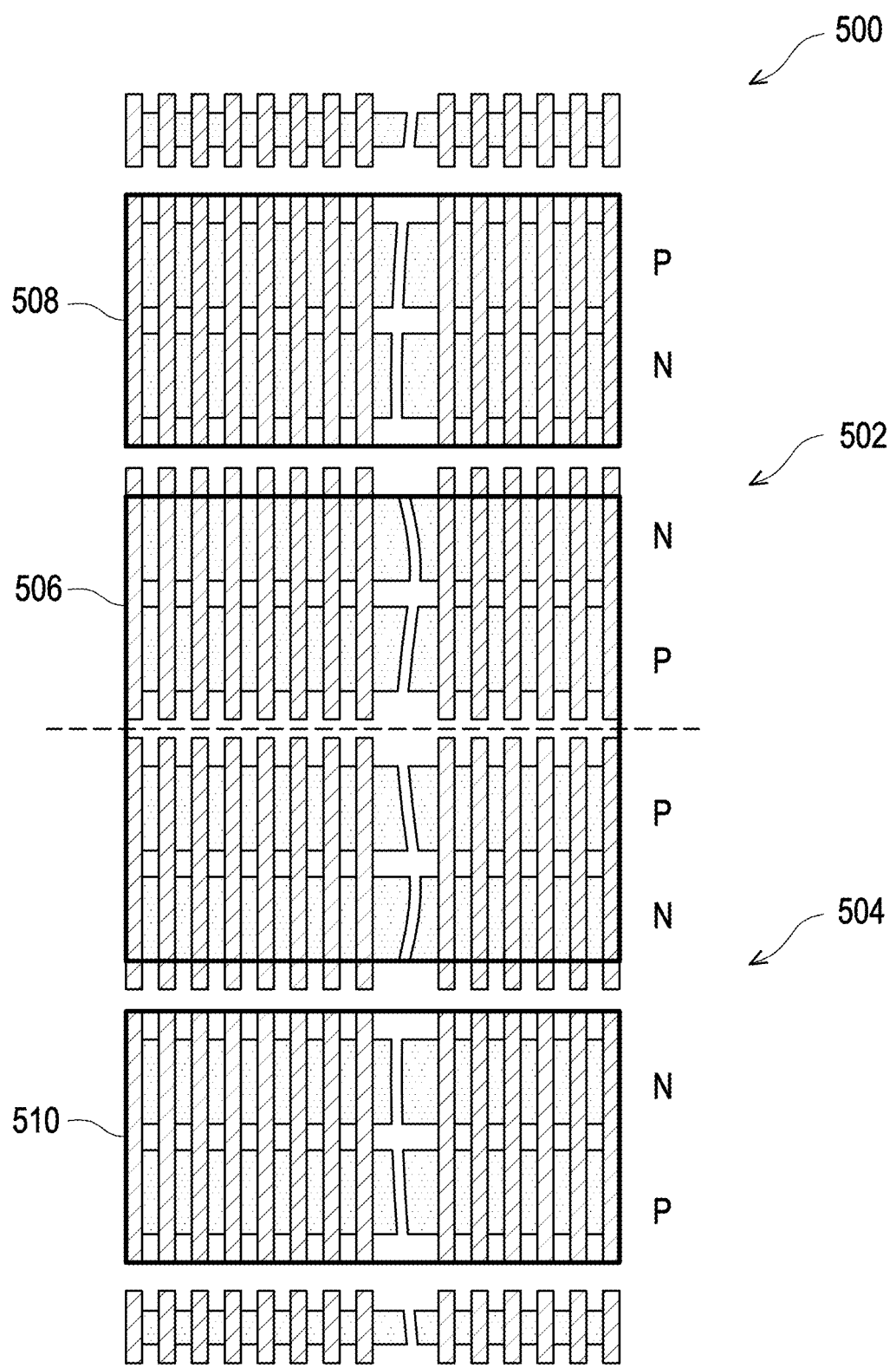
FIG. 14 is a diagram schematically illustrating a semiconductor device that is configured to include one or more stacked gate delay cells that include pseudo load transistors, in accordance with some embodiments.
Figure 15:
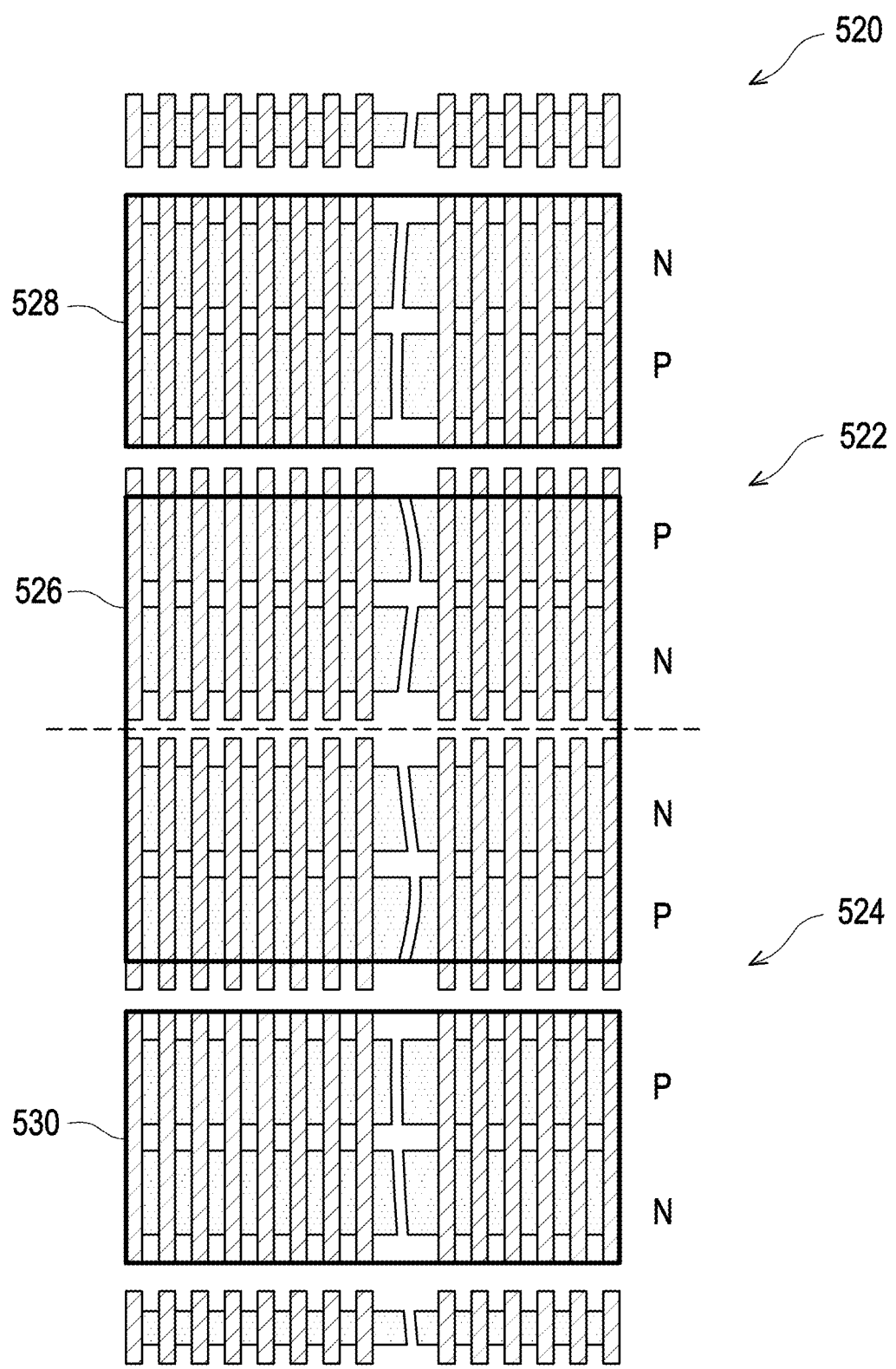
FIG. 15 is a diagram schematically illustrating a semiconductor device that is configured to include one or more stacked gate delay cells that include pseudo load transistors and that has a different active region sequence than the device of FIG. 14, in accordance with some embodiments.
Figure 16:
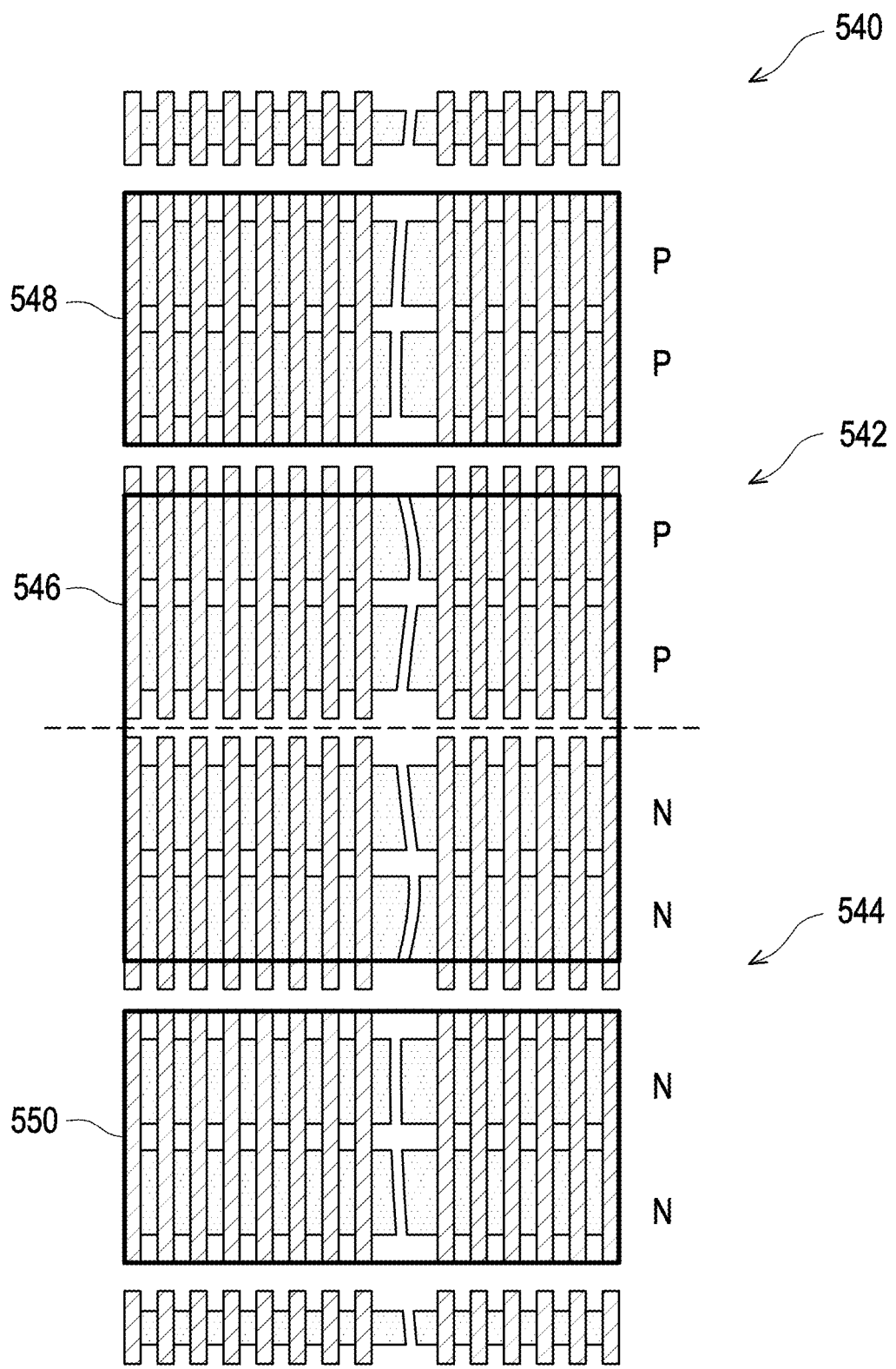
FIG. 16 is a diagram schematically illustrating a semiconductor device that is configured to include one or more stacked gate delay cells that include pseudo load transistors and that has a different active region sequence than the device of FIG. 14 and the device of FIG. 15, in accordance with some embodiments.

FIGS. 14-16 are diagrams schematically illustrating semiconductor devices that are configured to include one or more stacked gate delay cells that include pseudo load transistors. The devices in FIGS. 14-16 are configured to include one or more stacked gate delay cells that include pseudo load transistors, such as the stacked gate delay cell 300 of FIG. 8 and the stacked gate delay cell 400 of FIG. 13. The stacked gate delay cells can include a stacked gate delay cell #1 with pseudo load transistors, a stacked gate delay cell #2 with pseudo load transistors, a stacked gate delay cell #3 with pseudo load transistors, and so on.

FIG. 14 is a diagram schematically illustrating a semiconductor device 500 that is configured to include one or more stacked gate delay cells that include pseudo load transistors, in accordance with some embodiments. The device 500 includes PMOS active regions and NMOS active regions in a sequence of PNNP in a top portion 502 and PNNP in a bottom portion 504.

The device 500 includes a first region 506, a second region 508, and a third region 510. The first region 506 is a central region that includes the active transistors of the stacked gate delay cell, such as the PMOS and NMOS transistors 306 and 308 (shown in FIG. 8) and the PMOS and NMOS transistors 408 and 410 (shown in FIG. 13). These active switching transistors are placed in the first region 506 to shorten conductive routing lines between delay cells, such as the delay cells 22a-22n in ring oscillator 20 of FIG. 1, which reduces parasitic resistances and capacitances of critical conductive nets in the device 500.

The second region 508 and the third region 510 include pseudo load transistors, such as PMOS pseudo load transistor 302 and NMOS pseudo load transistor 304 (shown in FIG. 8) and PMOS pseudo load transistors 404a-404d and NMOS pseudo load transistors 406a-406d (shown in FIG. 13). The pseudo load transistors are laid out in the second and third regions 508 and 510 in top and bottom surrounding areas, which may be density gradient effect (DGE) dummy patterns, such that there is no extra area cost, and which enhances area efficiency.

Advantages of the layout of device 500 include keeping uniform channel lengths, achieving improved yields, reducing DGE surrounding areas, and providing lower mismatches in the transistors.

FIG. 15 is a diagram schematically illustrating a semiconductor device 520 that is configured to include one or more stacked gate delay cells that include pseudo load transistors and that has a different active region sequence than the device 500 of FIG. 14, in accordance with some embodiments. The device 520 includes PMOS active regions and NMOS active regions in a sequence of NPPN in a top portion 522 and NPPN in a bottom portion 524.

The device 520 further includes a first region 526, a second region 528, and a third region 530. Where, the first region 526 is like the first region 506 (shown in FIG. 14), the second region 528 is like the second region 508 (shown in FIG. 14), and the third region 530 is like the third region 510 (shown in FIG. 14), such that they will not be again described here.

Advantages of the layout of the device 520 are like the advantages of the layout of the device 500 of FIG. 14, including keeping uniform channel lengths, achieving improved yields, reducing DGE surrounding areas, and providing lower mismatches in the transistors.

FIG. 16 is a diagram schematically illustrating a semiconductor device 540 that is configured to include one or more stacked gate delay cells that include pseudo load transistors and that has a different active region sequence than the device 500 of FIG. 14 and the device 520 of FIG. 15, in accordance with some embodiments. The device 540 includes PMOS active regions and NMOS active regions in a sequence of PPPP in a top portion 542 and NNNN in a bottom portion 544.

The device 540 further includes a first region 546, a second region 548, and a third region 550. Where, the first region 546 is like the first region 506 (shown in FIG. 14), the second region 548 is like the second region 508 (shown in FIG. 14), and the third region 550 is like the third region 510 (shown in FIG. 14), such that they will not be again described here.

Advantages of the layout of the device 540 are like the advantages of the layouts of the device 500 of FIG. 14 and the device 520 of FIG. 15, including keeping uniform channel lengths, achieving improved yields, reducing DGE surrounding areas, and providing lower mismatches in the transistors.

Figure 17:
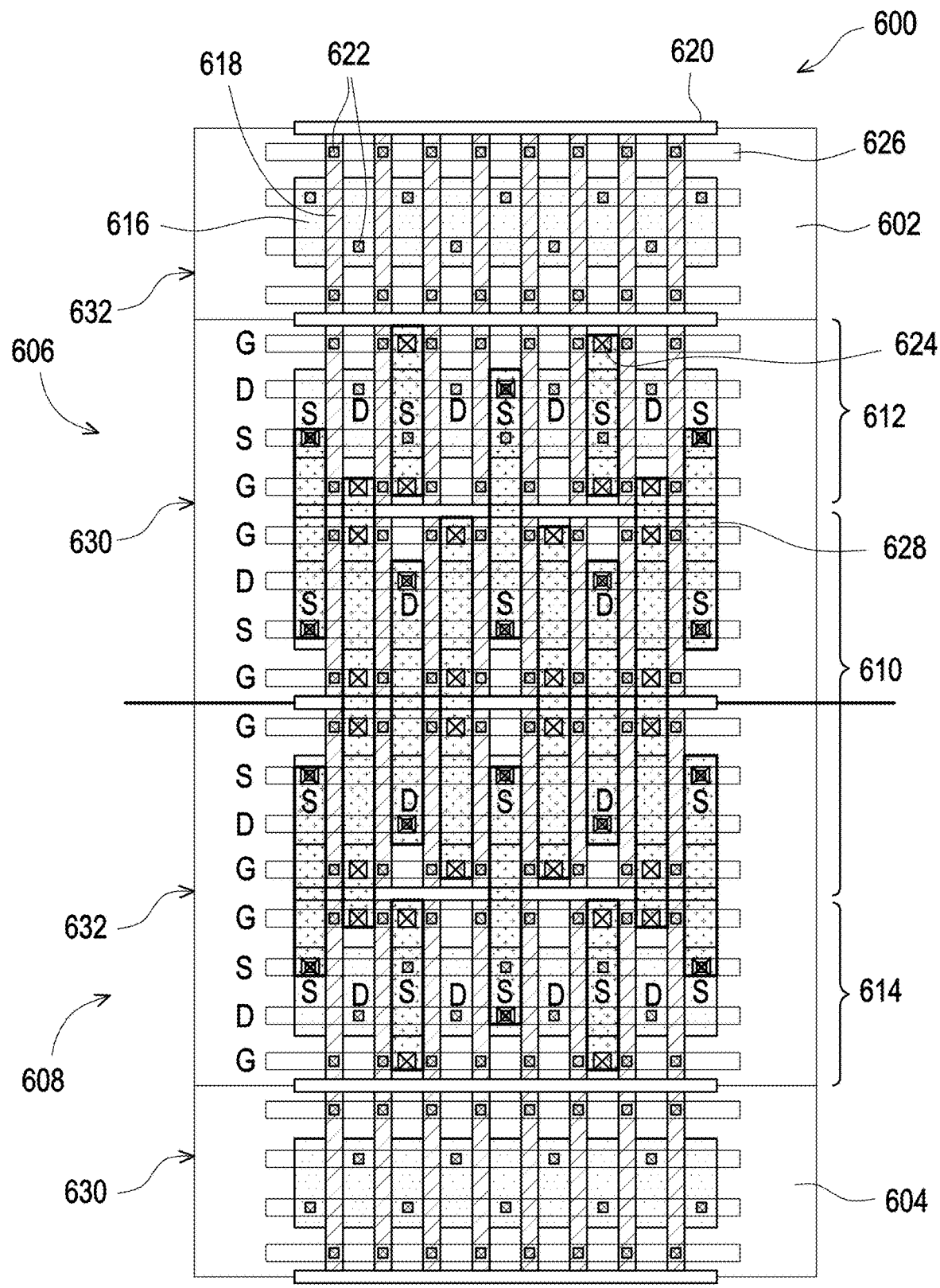
FIG. 17 is a diagram schematically illustrating a semiconductor device that is configured to include one or more stacked gate delay cells that include pseudo load transistors and that includes an N-tap region and a P-tap region, in accordance with some embodiments.

FIG. 17 is a diagram schematically illustrating a semiconductor device 600 that is configured to include one or more stacked gate delay cells that include pseudo load transistors and that includes an N-tap region 602 and a P-tap region 604, in accordance with some embodiments. The N-tap region 602 is situated in a top portion 606 of the device 600 and the P-tap region 604 is situated in a bottom portion 608 of the device 600. The N-tap region 602 and the P-tap region 604 provide power and reference voltages/currents. The device 600 further includes a first region 610, a second region 612, and a third region 614, where the first region 610 is a central region situated between the second region 612 and the third region 614 and situated in both the top portion 606 and the bottom portion 608, the second region 612 is situated in the top portion 606, and the third region 614 is situated in the bottom portion 608.

The device 600 is configured to include one or more stacked gate delay cells that include pseudo load transistors, such as the stacked gate delay cell 300 of FIG. 8 and the stacked gate delay cell 400 of FIG. 13. The stacked gate delay cells can include a stacked gate delay cell #1 with pseudo load transistors, a stacked gate delay cell #2 with pseudo load transistors, a stacked gate delay cell #3 with pseudo load transistors, and so on.

The device 600 includes oxide diffusion regions (OD) 616, gate poly regions (PO) 618, cut poly regions (CPO) 620, vias over gates and vias over diffusions (VG/VD) 622, vias between metal layers (V0) 624, first layer metal (M0) 626, second layer metal (M1) 628, P regions (PP) 630, and N regions (NN) 632. The oxide diffusion regions 616 define active areas for the transistors, i.e., the active areas where a source, a drain, and a channel under the gate of a transistor are formed in the device 600. The gate poly regions 618 include polycrystalline silicon (poly) that is used for gate contact material, and the cut poly regions 620 are where the gate poly has been or will be removed.

The first region 610 is a central region that includes the active transistors of the stacked gate delay cell, such as the PMOS and NMOS transistors 306 and 308 (shown in FIG. 8) and the PMOS and NMOS transistors 408 and 410 (shown in FIG. 13). These active switching transistors are placed in the first region 610 to shorten conductive routing lines between delay cells, such as the delay cells 22a-22n in ring oscillator 20 of FIG. 1, which reduces parasitic resistances and capacitances of critical conductive nets in the device 600.

The second region 612 and the third region 614 include pseudo load transistors, such as PMOS pseudo load transistor 302 and NMOS pseudo load transistor 304 (shown in FIG. 8) and PMOS pseudo load transistors 404a-404d and NMOS pseudo load transistors 406a-406d (shown in FIG. 13). The pseudo load transistors are placed in the second and third regions 612 and 614 in top and bottom surrounding areas, which may be DGE dummy patterns, such that there is no extra area cost, and which enhances area efficiency. Also, the pseudo load transistors are placed in the second and third regions 612 and 614, such that they can be routed to the N-tap region 602 and the P-tap region 604 for power and reference voltages/currents.

Advantages of the layout of device 600 include keeping uniform channel lengths, achieving improved yields, reducing DGE surrounding areas, and providing lower mismatches in the transistors.

Figure 18:
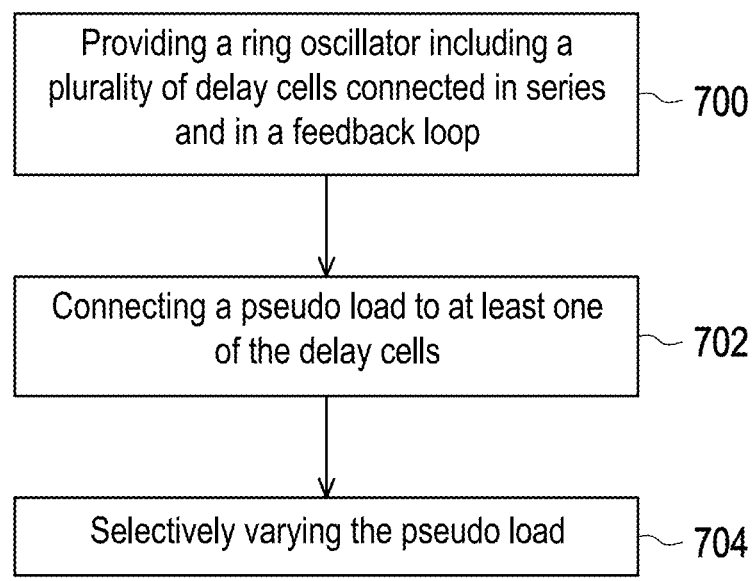
FIG. 18 is a diagram schematically illustrating a method of operating a ring oscillator, in accordance with some embodiments.

FIG. 18 is a diagram schematically illustrating a method of operating a ring oscillator, in accordance with some embodiments. The ring oscillator can be like the ring oscillators described herein. In some embodiments, the ring oscillator is like the ring oscillator 20 of FIG. 1.

At step 700, the method includes providing a ring oscillator including a plurality of delay cells connected in series and in a feedback loop and, at step 702, the method includes connecting a pseudo load to at least one of the delay cells. At step 704, the method includes selectively varying the pseudo load.

In some embodiments, the pseudo load includes a plurality of pseudo load transistors each having drain and source regions connected to each other and, in some embodiments, selectively varying the pseudo load includes selectively connecting a predetermined number of the plurality of pseudo load transistors to the at least one delay cell.

Further, in some embodiments, at least one delay cell includes a PMOS transistor having a first drain/source path and a first gate, and an NMOS transistor having a second drain/source path connected to the first drain/source path and a second gate connected to the first gate. In some embodiments, the plurality of pseudo load transistors each include a pseudo load gate connected to at least one of the PMOS transistor and the NMOS transistor of the at least one delay cell and, in some embodiments, selectively connecting the predetermined number of the plurality of pseudo load transistors to the at least one delay cell includes selectively connecting the drain and source regions of the predetermined number of the plurality of pseudo load transistors to at least one of the first drain/source path and/or the second drain/source path.

Further, in some embodiments, the plurality of pseudo load transistors includes a plurality of PMOS pseudo load transistors and a plurality of NMOS pseudo load transistors, the pseudo load gates of each of the PMOS pseudo load transistors connected to the first gate, and the pseudo load gates of each of the NMOS pseudo load transistors connected to the second gate. Also, in some embodiments, selectively connecting the predetermined number of the plurality of pseudo load transistors to the at least one delay cell includes selectively connecting the drain and source regions of the plurality of PMOS pseudo load transistors to the first drain/source path, and selectively connecting the drain and source regions of the plurality of NMOS pseudo load transistors to the second drain/source path.

In addition, in some embodiments, the method includes providing a plurality of first control bits each configured to selectively connect the drain and source regions of a corresponding one of the plurality of PMOS pseudo load transistors to the first drain/source path and providing a plurality of second control bits each configured to selectively connect the drain and source regions of a corresponding one of the plurality of NMOS pseudo load transistors to the second drain/source path. Where, in some embodiments, selectively connecting the drain and source regions of the plurality of PMOS pseudo load transistors to the first drain/source path includes selectively activating predetermined ones of the first control bits, and selectively connecting the drain and source regions of the plurality of NMOS pseudo load transistors to the second drain/source path includes selectively activating predetermined ones of the second control bits.

Disclosed embodiments thus provide devices that reduce PN in ring oscillators, without costly inductors, variable capacitors, and/or complex filters. In some embodiments, the ring oscillators include stacked gate delay cells, and, in some embodiments, the ring oscillators include delay cells with pseudo load transistors. The stacked gate delay cells have larger effective channel areas that reduce the PN of the delay cell and the PN of the ring oscillator. The delay cells with pseudo load transistors receive larger currents Id, which reduces the rise and fall times of the delay cells and the PN of the ring oscillator.

Disclosed embodiments include devices that include delay cells connected in series and in a feedback loop to provide a ring oscillator, wherein at least one of the delay cells is a stacked gate delay cell that includes two or more PMOS transistors connected to two or more NMOS transistors. The two or more PMOS transistors have first drain/source paths connected in series to each other and the two or more NMOS transistors have second drain/source paths connected in series to each other and to the first drain/source paths of the two or more PMOS transistors. The gates of the two or more PMOS transistors are connected to the gates of the two or more NMOS transistors.

Disclosed embodiments further include devices that include delay cells connected in series and in a feedback loop to provide a ring oscillator, wherein at least one of the delay cells includes at least one PMOS transistor that has a first drain/source path and at least one NMOS transistor that has a second drain/source path connected to the first drain/source path. The at least one of the delay cells includes a pseudo load PMOS transistor that has drain and source regions connected to each other and to the first drain/source path and a pseudo load NMOS transistor that has drain and source regions connected to each other and to the second drain/source path.

Disclosed embodiments further include methods that include providing a ring oscillator including a plurality of delay cells connected in series and in a feedback loop and including one or more pseudo load transistors. In some embodiments, the method includes connecting a pseudo load, such as a programmable pseudo load circuit, to at least one of the delay cells, and selectively varying the pseudo load, such as by individually selectively connecting one or more pseudo load transistors to active transistors in at least one of the delay cells.

In accordance with some embodiments, a device includes delay cells connected in series and in a feedback loop to provide a ring oscillator. At least one of the delay cells in the ring oscillator is a stacked gate delay cell that includes two or more PMOS transistors having first drain/source paths connected in series to each other and having first gates connected to each other and two or more NMOS transistors having second drain/source paths connected in series to each other and to the first drain/source paths and having second gates connected to each other and to the first gates.

In accordance with further embodiments, a device includes delay cells connected in series and in a feedback loop to provide a ring oscillator. At least one of the delay cells includes at least one PMOS transistor having a first drain/source path and at least one NMOS transistor having a second drain/source path connected to the first drain/source path, first gates of the at least one PMOS transistor and the at least one NMOS transistor connected to each other. The at least one of the delay cells includes a pseudo load PMOS transistor having drain and source regions connected to each other and to the first drain/source path and a pseudo load NMOS transistor having drain and source regions connected to each other and to the second drain/source path, second gates of the pseudo load PMOS transistor and the pseudo load NMOS transistor connected to each other and to the first gates.

In accordance with still further disclosed aspects, a method includes providing a ring oscillator including a plurality of delay cells connected in series and in a feedback loop; connecting a pseudo load to at least one of the delay cells; and selectively varying the pseudo load.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device, comprising:
delay cells connected in series and in a feedback loop to provide a ring oscillator,
wherein at least one of the delay cells in the ring oscillator is a stacked gate delay cell that includes:

two or more PMOS transistors having first drain/source paths connected in series to each other and having first gates connected to each other; and two or more NMOS transistors having second drain/source paths connected in series to each other and to the first drain/source paths and having second gates connected to each other and to the first gates, and wherein the stacked gate delay cell includes a first number of PMOS transistors and a second number of NMOS transistors, such that the first number is different than the second number.

2. The device of claim 1, wherein each of the delay cells in the ring oscillator is the stacked gate delay cell.

3. The device of claim 1, wherein each of the delay cells in the ring oscillator includes a same number of PMOS transistors and a same number of NMOS transistors as all other delay cells in the ring oscillator.

4. The device of claim 1, wherein the stacked gate delay cell includes a first number of pseudo load PMOS transistors each having drain and source regions connected and a second number of pseudo load NMOS transistors each having drain and source regions connected, such that the first number is different than the second number.

5. The device of claim 1, wherein the ring oscillator includes an odd number of delay cells and each of the delay cells is an inverter.

6. The device of claim 1, wherein the stacked gate delay cell includes at least three PMOS transistors and at least three NMOS transistors.

7. The device of claim 1, wherein one or more of the delay cells includes a pseudo load PMOS transistor having drain and source regions connected and a pseudo load NMOS transistor having drain and source regions connected.

8. The device of claim 1, wherein the stacked gate delay cell includes a pseudo load PMOS transistor having drain and source regions connected and a pseudo load NMOS transistor having drain and source regions connected, wherein gates of the pseudo load PMOS transistor and the pseudo load NMOS transistor are connected to the first gates and the second gates.

9. The device of claim 1, wherein one or more of the delay cells includes programmable pseudo load PMOS transistors each having drain and source regions connected and programmable pseudo load NMOS transistors each having drain and source regions connected.

10. The device of claim 1, wherein the stacked gate delay cell includes at least one programmable pseudo load PMOS transistor having drain and source regions connected and at least one programmable pseudo load NMOS transistor having drain and source regions connected.

11. A device, comprising:
delay cells connected in series and in a feedback loop to provide a ring oscillator,
wherein at least one of the delay cells includes at least one PMOS transistor having a first drain/source path and at least one NMOS transistor having a second drain/source path connected to the first drain/source path, first gates of the at least one PMOS transistor and the at least one NMOS transistor connected to each other, and
the at least one of the delay cells includes a pseudo load PMOS transistor having drain and source regions connected to each other and to the first drain/source path and a pseudo load NMOS transistor having drain and source regions connected to each other and to the second drain/source path, second gates of the pseudo load PMOS transistor and the pseudo load NMOS transistor connected to each other and to the first gates, and wherein one or more of the delay cells includes programmable pseudo load PMOS transistors having third gates and programmable pseudo load NMOS transistors having fourth gates connected to each other and to the third gates.

12. The device of claim 11, wherein each of the delay cells in the ring oscillator includes a same number of PMOS transistors and a same number of NMOS transistors as all other delay cells in the ring oscillator.

13. The device of claim 11, wherein each of the programmable pseudo load PMOS transistors has drain and source regions connected and each of the programmable pseudo load NMOS transistors has drain and source regions connected.

14. The device of claim 11, wherein each of the programmable pseudo load PMOS transistors and each of the programmable pseudo load NMOS transistors is individually selectable via a control bit.

15. The device of claim 11, wherein the one or more of the delay cells includes a first number of programmable pseudo load PMOS transistors having third gates and a second number of programmable pseudo load NMOS transistors having fourth gates connected to each other and to the third gates, wherein the first number is different than the second number.

16. A method, comprising:
providing a ring oscillator including a plurality of delay cells connected in series and in a feedback loop;
connecting a pseudo load to at least one of the delay cells; and
selectively varying the pseudo load,
wherein the pseudo load includes a plurality of pseudo load transistors each having drain and source regions connected to each other, and wherein selectively varying the pseudo load includes selectively connecting a predetermined number of the plurality of pseudo load transistors to the at least one delay cell,
wherein the at least one delay cell includes a PMOS transistor having a first drain/source path and a first gate, and an NMOS transistor having a second drain/source path connected to the first drain/source path od gate connected to the first gate,
wherein the plurality of pseudo load transistors each include a pseudo load gate connected to at least one of the PMOS transistor and the NMOS transistor of the at least one delay cell, and
wherein selectively connecting the predetermined number of the plurality of pseudo load transistors to the at least one delay cell includes selectively connecting the drain and source regions of the predetermined number of the plurality of pseudo load transistors to at least one of the first drain/source path and/or the second drain/source path.

17. The method of claim 16,
wherein the plurality of pseudo load transistors include a plurality of PMOS pseudo load transistors and a plurality of NMOS pseudo load transistors, the pseudo load gates of each of the PMOS pseudo load transistors connected to the first gate, and the pseudo load gates of each of the NMOS pseudo load transistors connected to the second gate.

18. The method of claim 17, wherein selectively connecting the predetermined number of the plurality of pseudo load transistors to the at least one delay cell includes selectively connecting the drain and source regions of the plurality of PMOS pseudo load transistors to the first drain/source path, and selectively connecting the drain and source regions of the plurality of NMOS pseudo load transistors to the second drain/source path.

19. The method of claim 18, further comprising:
providing a plurality of first control bits each configured to selectively connect the drain and source regions of a corresponding one of the plurality of PMOS pseudo load transistors to the first drain/source path; and
providing a plurality of second control bits each configured to selectively connect the drain and source regions of a corresponding one of the plurality of NMOS pseudo load transistors to the second drain/source path.

20. The method of claim 19, wherein selectively connecting the drain and source regions of the plurality of PMOS pseudo load transistors to the first drain/source path includes selectively activating predetermined ones of the first control bits, and wherein selectively connecting the drain and source regions of the plurality of NMOS pseudo load transistors to the second drain/source path includes selectively activating predetermined ones of the second control bits.

\* \* \* \* \*